(12) United States Patent
Saito et al.

(10) Patent No.: US 9,865,770 B2
(45) Date of Patent: Jan. 9, 2018

(54) SEMICONDUCTOR LIGHT EMITTING ELEMENT AND METHOD FOR MANUFACTURING THE SAME

(71) Applicant: Kabushiki Kaisha Toshiba, Minato-ku (JP)

(72) Inventors: Shinji Saito, Yokohama (JP); Rei Hashimoto, Edogawa (JP); Jongil Hwang, Nonoichi (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/994,779

(22) Filed: Jan. 13, 2016

(65) Prior Publication Data
US 2016/0126411 A1 May 5, 2016

Related U.S. Application Data

(63) Continuation of application No. PCT/JP2014/069269, filed on Jul. 15, 2014.

(30) Foreign Application Priority Data

Jul. 17, 2013 (JP) .................................. 2013-148852
Dec. 18, 2013 (JP) .................................. 2013-261281

(51) Int. Cl.
*H01L 33/06* (2010.01)
*H01L 33/00* (2010.01)
*H01L 33/32* (2010.01)

(52) U.S. Cl.
CPC .......... *H01L 33/06* (2013.01); *H01L 33/0025* (2013.01); *H01L 33/0075* (2013.01); *H01L 33/32* (2013.01)

(58) Field of Classification Search
CPC . H01L 33/06; H01L 33/0025; H01L 33/0075; H01L 33/32
See application file for complete search history.

(56) References Cited

U.S. PATENT DOCUMENTS 6,738,175 B2 * 5/2004 Morita .................. B82Y 20/00
257/13
8,604,496 B2 12/2013 Shioda et al.
(Continued)

FOREIGN PATENT DOCUMENTS

DE 10 2009 015 569 A1 10/2010
EP 1 383 176 A1 1/2004
(Continued)

OTHER PUBLICATIONS

Combined Office Action and Search Report dated Aug. 5, 2015 in Taiwanese Patent Application No. 103124532 with English translation.
(Continued)

*Primary Examiner* — Cheung Lee
*Assistant Examiner* — Stephen C Smith
(74) *Attorney, Agent, or Firm* — Oblon, McClelland, Maier & Neustadt, L.L.P.

(57) ABSTRACT

According to one embodiment, a light emitting element includes n-type and p-type semiconductor layers and a light emitting unit. The light emitting unit is provided between the n-type semiconductor layer and the p-type semiconductor layer, the light emitting unit emits light with a peak wavelength of not less than 530 nm. The light emitting unit includes an n-side barrier layer and a first light emitting layer. The first light emitting layer includes a first barrier layer provided between the n-side barrier layer and the p-type semiconductor layer, a first well layer contacting the n-side barrier layer between the n-side barrier layer and the first barrier layer, a first AlGaN layer provided between the
(Continued)

first well layer and the first barrier layer and including $Al_{x1}Ga_{1-x1}N$ (0.15≤x1≤1), and a first p-side InGaN layer provided between the first AlGaN layer and the first barrier layer and including $In_{ya1}Ga_{1-ya1}N$ (0<ya1≤0.1).

15 Claims, 13 Drawing Sheets

(56) References Cited

U.S. PATENT DOCUMENTS

| | | | |
|---|---|---|---|
| 2004/0113169 A1 | 6/2004 | Asami et al. | |
| 2007/0262293 A1 | 11/2007 | Fujikura | |
| 2008/0149917 A1 | 6/2008 | Park | |
| 2008/0217632 A1 | 9/2008 | Tomiya et al. | |
| 2009/0278113 A1* | 11/2009 | Chung | H01L 33/06 257/13 |
| 2011/0037049 A1 | 2/2011 | Tachibana et al. | |
| 2011/0042646 A1* | 2/2011 | Ohta | B82Y 20/00 257/14 |
| 2011/0168979 A1 | 7/2011 | Shur et al. | |
| 2011/0204394 A1* | 8/2011 | Hikosaka | H01L 33/06 257/94 |
| 2011/0240957 A1* | 10/2011 | Okuno | H01L 33/04 257/13 |
| 2012/0012814 A1 | 1/2012 | Harada et al. | |
| 2013/0028281 A1 | 1/2013 | Avramescu et al. | |

FOREIGN PATENT DOCUMENTS

| | | |
|---|---|---|
| EP | 1 667 292 A1 | 6/2006 |
| JP | 2003-17743 | 1/2003 |
| JP | 2004-31770 | 1/2004 |
| JP | 2011-176240 | 9/2011 |
| JP | 2012-44194 A | 3/2012 |
| JP | 5044692 | 10/2012 |

OTHER PUBLICATIONS

J.I. Hwang, et al. "Development of InGaN-based red LED grown on (0001) polar surface," Applied Physics Express 7, 071003, (2014), pp. 071003-1-to 071003-4 plus cover page.

S. Saito, et al. "InGaN Light-Emitting Diodes on c-Face Sapphire Substrates in Green Gap Spectral Range," Applied Physics Express 6, 111004, (2013), pp. 111004-1 to 111004-4 plus cover page.

International Search Report dated Oct. 27, 2014 in PCT/JP2014/069269 filed Jul. 15, 2014.

Written Opinion dated Oct. 27, 2014 in PCT/JP2014/069269 filed Jul. 15, 2014.

WIPO Communication for PCT/JP2014/069269, dated Mar. 17, 2015.

Combined Taiwanese Office Action and Search Report dated Jan. 21, 2016 in Patent Application No. 103124532 with partial English translation and English translation of category of cited documents.

* cited by examiner

FIG. 14A
115a
Z⊙
FIG. 14B
115b
Z⊙
FIG. 14C
112a
Z⊙
FIG. 14D
115a
Z⊙
FIG. 14E
115b
Z⊙
FIG. 14F
112a
Z⊙
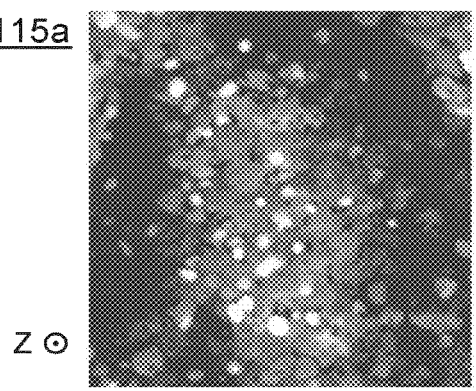
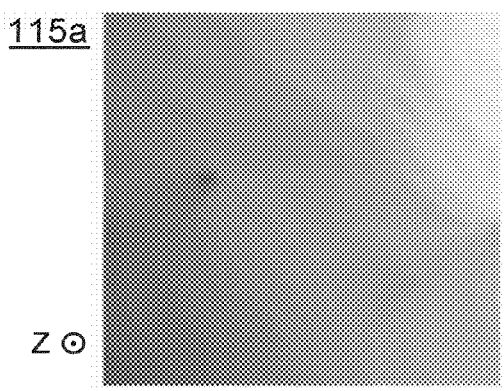
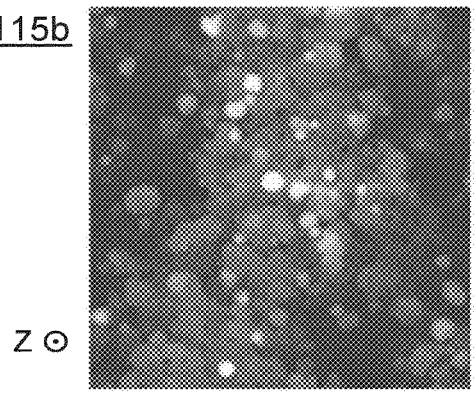
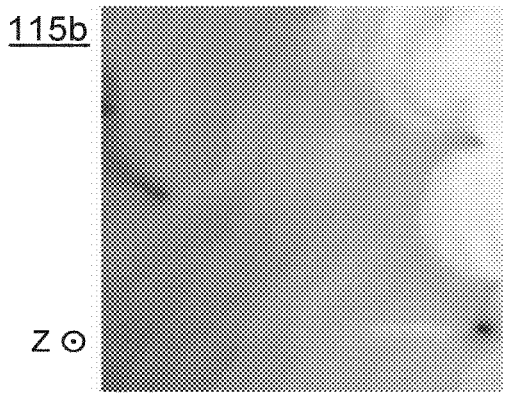
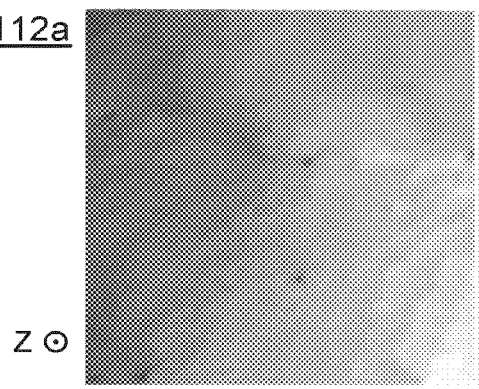
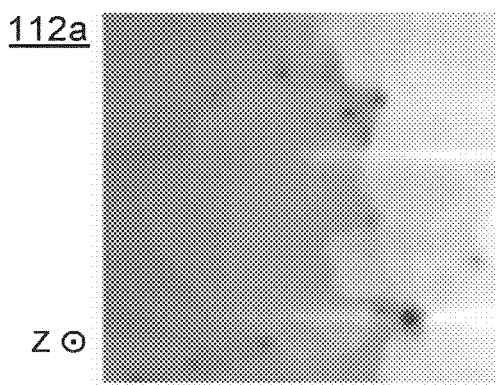

SEMICONDUCTOR LIGHT EMITTING ELEMENT AND METHOD FOR MANUFACTURING THE SAME

CROSS-REFERENCE TO RELATED APPLICATIONS

This application is based upon and claims the benefit of priority from Japanese Patent Application No. 2013-148852, filed on Jul. 17, 2013, No. 2013-261281, filed on Dec. 18, 2013 and PCT International Patent Application PCT/JP2014/069269, filed on Jul. 15, 2014; the entire contents of which are incorporated herein by reference.

FIELD

Embodiments described herein relate generally to a semiconductor light emitting element and a method for manufacturing the same.

BACKGROUND

Light emitting diodes (LEDs) made from semiconductor light emitting elements using nitride semiconductor are used, for example, in display devices, lighting devices, and the like. In these semiconductor light emitting elements, high efficiency is required.

BRIEF DESCRIPTION OF THE DRAWINGS

FIGS. 14A to 14F are schematic views illustrating the semiconductor light emitting element according to the embodiment;

DETAILED DESCRIPTION

Figure 1A:
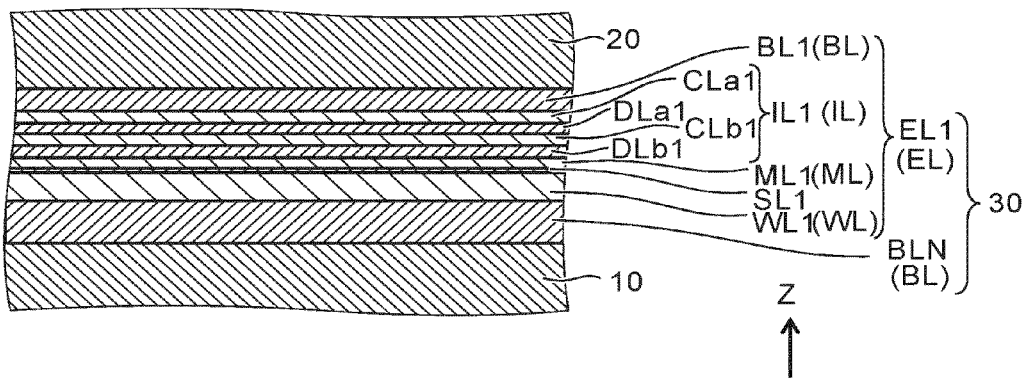
FIGS. 1A and 1B are schematic cross-sectional views illustrating configurations of a semiconductor light emitting element according to a first embodiment.

According to one embodiment, a light emitting element includes an n-type semiconductor layer including a nitride semiconductor, a p-type semiconductor layer including a nitride semiconductor, and a light emitting unit. The light emitting unit is provided between the n-type semiconductor layer and the p-type semiconductor layer, the light emitting unit emits light with a peak wavelength of not less than 530 nm. The light emitting unit includes an n-side barrier layer and a first light emitting layer. The first light emitting layer includes a first barrier layer provided between the n-side barrier layer and the p-type semiconductor layer, a first well layer contacting the n-side barrier layer between the n-side barrier layer and the first barrier layer, a first AlGaN layer provided between the first well layer and the first barrier layer and including $Al_{x1}Ga_{1-x1}N$ (0.15≤x1≤1), and a first p-side InGaN layer provided between the first AlGaN layer and the first barrier layer and including $In_{ya1}Ga_{1-ya1}N$ (0<ya1≤0.1).

According to one embodiment, a method for manufacturing a semiconductor light emitting element, includes forming a first well layer at a first temperature on an n-side barrier layer, the n-side barrier layer being provided on an n-type semiconductor layer, the n-type semiconductor layer including nitride semiconductor. The method includes forming a first AlGaN layer including $Al_{x1}Ga_{1-x1}N$ (0.15≤x1≤1) on the first well layer at a second temperature, the second temperature being higher than the first temperature. The method includes forming a first p-side InGaN layer including $In_{ya1}Ga_{1-ya1}N$ (0<ya1<1) on the first AlGaN layer at a third temperature, the third temperature being higher than the first temperature. The method includes forming a first barrier layer BL on the first p-side InGaN layer at a fourth temperature, the fourth temperature being higher than the first temperature.

Embodiments are described hereinafter while referring to the drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

First Embodiment

Figure 1B:
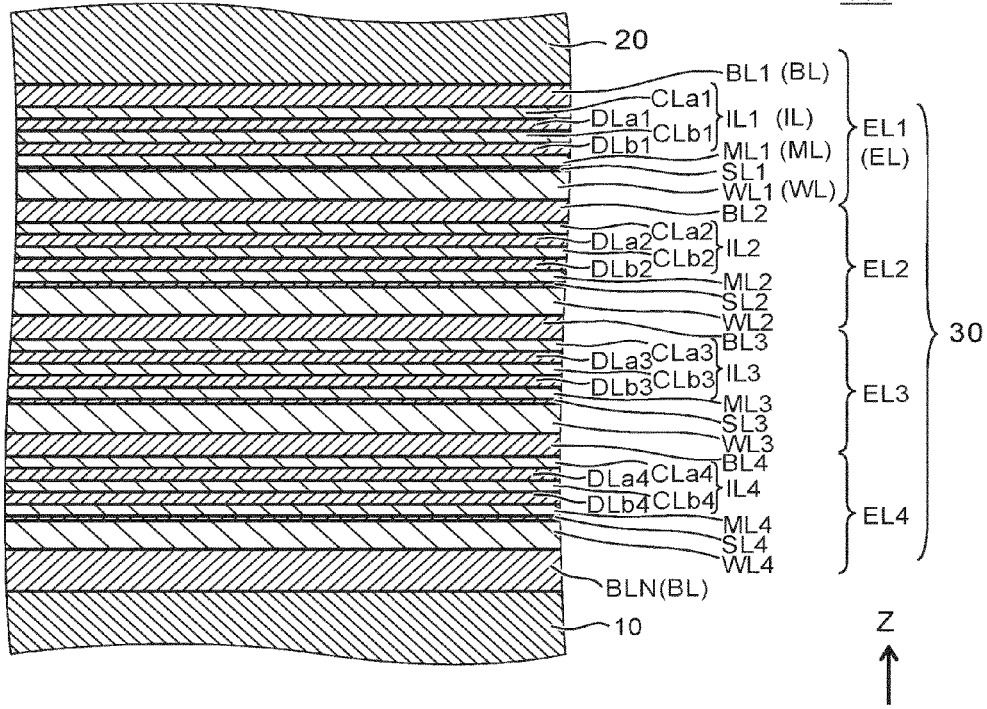

FIGS. 1A and 1B are schematic cross-sectional views illustrating configurations of a semiconductor light emitting element according to a first embodiment.

As illustrated in FIG. 1A, a semiconductor light emitting element 110 according to this embodiment includes an n-type semiconductor layer 10, a p-type semiconductor layer 20, and a light emitting unit 30.

The n-type semiconductor layer 10 and the p-type semiconductor layer 20 include nitride semiconductors.

The light emitting unit 30 is provided between the n-type semiconductor layer 10 and the p-type semiconductor layer 20. The light emitting unit 30 includes an n-side barrier layer BLN, and a first light emitting layer EL1. The first light emitting layer EL1 is provided between the n-side barrier layer BLN and the p-type semiconductor layer 20.

The direction from the n-type semiconductor layer 10 toward the p-type semiconductor layer 20 is defined as the "Z-axis direction"

The first light emitting layer EL1 includes a first barrier layer BL1, a first well layer WL1, a first AlGaN layer ML1, and a first p-side InGaN layer CLa1.

The first barrier layer BL1 is provided between the n-side barrier layer BLN and the p-type semiconductor layer 20. The first well layer WL1 is in contact with the n-side barrier layer BLN between the n-side barrier layer BLN and the first barrier layer BL1. The first AlGaN layer ML1 is provided between the first well layer WL1 and the first barrier layer BL1, and includes $Al_{x1}Ga_{1-x1}N$ ($0.15 \le x1 \le 1$). The first p-side InGaN layer CLa1 is provided between the first AlGaN layer ML1 and the first barrier layer BL1, and includes $In_{ya1}Ga_{1-ya1}N$ ($0 < ya1 \le 0.1$).

The number of well layers WL in the semiconductor light emitting element 110 is 1. In this way, the light emitting unit 30 can have a single quantum well (SQW) configuration.

As illustrated in FIG. 1B, in another semiconductor light emitting element 111 according to this embodiment, the light emitting unit 30 further includes a second light emitting layer EL2. The second light emitting layer EL2 includes, for example, a second barrier layer BL2, a second well layer WL2, a second AlGaN layer ML2, and a second p-side InGaN layer CLa2.

The second well layer WL2 is provided between the first well layer WL1 and the n-type semiconductor layer 10. The second barrier layer BL2 is in contact with the first well layer WL1 between the first well layer WL1 and the second well layer WL2. The second AlGaN layer ML2 is provided between the second well layer WL2 and the second barrier layer BL2, and includes $Al_{x2}Ga_{1-x2}N$ ($0.15 \le x2 \le 1$). The second p-side InGaN layer CLa2 is provided between the second AlGaN layer ML2 and the second barrier layer BL2, and includes $In_{ya2}Ga_{1-ya2}N$ ($0 < ya2 < 1$).

In the semiconductor light emitting element 111, a plurality of well layers WL is provided. In this way, the light emitting unit 30 can have a multiple quantum well (MQW) configuration. In this example, the number of well layers WL is, for example, 4. In other words, the number of light emitting layers EL is 4. In the semiconductor light emitting element according to this embodiment, there may be any number of well layers WL.

In the semiconductor light emitting element 111, the light emitting unit 30 includes, for example, a plurality of light emitting layers EL (first light emitting layer EL1 to nth light emitting layer ELn). Here, n is an integer of 2 or greater.

The (i+1)-th light emitting layer EL(i+1) is provided between the i-th light emitting layer ELi and the n-type semiconductor layer 10. Here, "i" is an integer of 1 or greater.

The i-th light emitting layer ELi includes an i-th barrier layer BLi, an i-th well layer WLi, an i-th AlGaN layer MLi, and an i-th p-side InGaN layer CLai.

The (i+1)-th well layer WL(i+1) is provided between the i-th well layer WLi and the n-type semiconductor layer 10. The (i+1)-th barrier layer BL(i+1) is in contact with the i-th well layer WLi between the i-th well layer WLi and the (i+1)-th well layer WL(i+1). The (i+1)-th AlGaN layer ML(i+1) is provided between the (i+1)-th well layer WL(i+1) and the (i+1)-th barrier layer BL(i+1), and includes $Al_{x(i+1)}Ga_{1-x(i+1)}N$ ($0.15 \le x(i+1) \le 1$). The (i+1)-th p-side InGaN layer CLa(i+1) is provided between the (i+1)-th AlGaN layer ML(i+1) and the (i+1)-th barrier layer BL(i+1), and includes $In_{ya(i+1)}Ga_{1-ya(i+1)}N$ ($0 < ya(i+1) \le 0.1$).

In the specification of this application, the first to nth barrier layers BL1 to BLn are sometimes collectively referred to as the barrier layer BL. The first to nth well layers WL1 to WLn are sometimes collectively referred to as the well layer WL. The first to nth AlGaN layers ML1 to MLn are sometimes collectively referred to as the AlGaN layer ML. The first to nth p-side InGaN layers CLa1 to CLan are sometimes collectively referred to as the p-side InGaN layer CLa.

In a plurality of AlGaN layers ML, the Al composition ratios (Al composition ratio within group-III) may be the same as each other, or may be different from each other. In any AlGaN layer ML, the Al composition ratio x is set to $0.15 \le x \le 1$. In any AlGaN layer ML, the Al composition ratio x (Al composition ratio within group-III) is, for example, not less than 0.25. The Al composition ratio x is, for example, not less than 0.3. In the following, to simplify the description, the Al composition ratio in the plurality of AlGaN layers ML is the same (Al composition ratio x is constant).

The thicknesses of the plurality of AlGaN layers ML may be the same as each other, or they may be different from each other. In any AlGaN layer ML, the thickness is set to, for example, 1 atomic layer or more and not more than 2 nm.

The band gap energy of the i-th well layer WLi is smaller than the band gap energy of the i-th barrier layer BLi, and smaller than the band gap energy of the n-side barrier layer BLN For example, an InGaN layer is used for the well layer WL, and a GaN layer is used for the barrier layer BL. When an InGaN layer is used for the barrier layer BL, the In composition ratio (In composition ratio in group-III) in the barrier layer BL is lower than the In composition ratio in the well layer WL.

The In composition ratio in the well layer WL is determined in accordance with the target wavelength of the light to be emitted. The In composition ratio in the well layer WL is, for example, not less than 0.2 and not more than 0.6.

In a plurality of p-side InGaN layers CLa, the In composition ratios (In composition ratio in group-III) may be the same as each other, or they may be different from each other. In any p-side InGaN layer CLa, the In composition ratio ya is set to $0 < ya \le 0.1$. In any p-side InGaN layer CLa, the In composition ratio ya is, for example, lower than the In composition ratio in the well layer WL. In any p-side InGaN layer CLa, the In composition ratio ya is, for example, not less than 0.002 and not more than 0.05. The In composition ratio ya is, for example, not less than 0.003 and not more than 0.03. In the following, to simplify the description, the In composition ratios in the plurality of p-side InGaN layers CLa are the same (In composition ratio ya is constant). In the plurality of p-side InGaN layers CLa, the In composition ratio is lower than the In composition ratio in the well layer WL.

The thicknesses of each of the plurality of p-side InGaN layers CLa may be the same as each other, or they may be different from each other. In any p-side InGaN layer CLa, the thickness is set to, for example, 1 atomic layer or more and not more than 2 nm. In the p-side InGaN layer CLa, when the In composition ratio ya is high, preferably the thickness is smaller. When the In composition ratio ya is not less than 0.05, the thickness of the p-side InGaN layer CLa is preferably, for example, less than 2 nm.

The thickness of the well layer WL is, for example, not less than 1.0 nanometer (nm) and not more than 5.0 nm. When the thickness of the well layer WL is less than 1.0 nm, it is difficult to obtain light emission with wavelengths longer than 530 nm. When the thickness of the well layer WL is greater than 5.0 nm, degradation of crystal quality can easily occur. In addition, the spatial separation of the wave functions of electrons and electron holes becomes larger, and the luminous intensity tends to become weaker.

The thickness of the barrier layer BL is, for example, not less than 3 nm and not more than 50 nm. When the thickness of the barrier layer BL is less than 3 nm, the wave functions between different well layers WL interfere, due to the narrowing of the gaps between the plurality of well layers WL. When the thickness of the barrier layer BL is not less than 3 nm, the interference of the wave functions in the well layers WL is suppressed. When the thickness of the barrier layer BL is greater than 50 nm, the thickness of the light emitting layer EL becomes too thick, and the operating voltage increases.

In the semiconductor light emitting element 110 and the semiconductor light emitting element 111, the first light emitting layer EL1 further includes, for example, a first n-side InGaN layer CLb1, a first p-side nitride including layer DLa1, and a first n-side nitride including layer DLb1. In this example, the first light emitting layer EL1 further includes a first intermediate layer SL1.

In the semiconductor light emitting element 111, the i-th light emitting layer ELi further includes an i-th n-side InGaN layer CLbi, an i-th p-side nitride including layer DLai, an i-th n-side nitride including layer DLbi, and a i-th intermediate layer SLi.

In the specification of this application, the first to nth n-side InGaN layer CLb1 to CLbn are sometimes collectively referred to as the n-side InGaN layer CLb. The first to nth p-side nitride including layer DLa1 to DLan are sometimes collectively referred to as the p-side nitride including layer DLa. The first to nth n-side nitride including layer DLb1 to DLbn are sometimes collectively referred to as the n-side nitride including layer DLb. The first to nth Intermediate layer SL1 to SLn are sometimes collectively referred to as the intermediate layer SL. The p-side InGaN layer CLa and the n-side InGaN layer CLb are sometimes collectively referred to as the InGaN layer CL. The p-side nitride including layer DLa and the n-side nitride including layer DLb are sometimes collectively referred to as the nitride including layer DL.

The n-side InGaN layer CLb is provided between the p-side InGaN layer CLa and the AlGaN layer ML, and includes $In_{yb}Ga_{1-yb}N$ ($0<yb\leq0.1$). The In composition ratio yb in the n-side InGaN layer CLb is, for example, lower than the In composition ratio in the well layer WL.

In the plurality of n-side InGaN layers CLb, the In composition ratios (In composition ratios in group-III) may be the same as each other, or may be different from each other. The In composition ratio of the n-side InGaN layer CLb may be the same as the In composition ratio of the p-side InGaN layer CLa, or it may be different. In any n-side InGaN layer CLb, the In composition ratio yb is set to $0<yb\leq0.1$. In any n-side InGaN layer CLb, the In composition ratio ya is, for example, not less than 0.002 and not more than 0.05. The In composition ratio yb is, for example, not less than 0.003 and not more than 0.03. In the following, to simplify the description, the In composition ratio in the plurality of n-side InGaN layers CLb is the same (In composition ratio yb is constant), and is the same as the In composition ratio of the p-side InGaN layer CLa. In the plurality of n-side InGaN layers CLb, the In composition ratio is lower than the In composition ratio in the well layer WL.

The p-side nitride including layer DLa is provided between the p-side InGaN layer CLa and the n-side InGaN layer CLb, and includes $In_{za}Ga_{1-za}N$ ($0\leq za<ya$, $0\leq za<yb$).

The n-side nitride including layer DLb is, for example, provided between the n-side InGaN layer CLb and the AlGaN layer ML, and includes $In_{zb}Ga_{1-zb}N$ ($0\leq zb<ya$, $0\leq zb<yb$).

The p-side nitride including layer DLa, for example, does not include In. The p-side nitride including layer DLa, for example, is GaN. The n-side nitride including layer DLb, for example, does not include In. The n-side nitride including layer DLb, for example, is GaN.

The intermediate layer SL is, for example, provided between the well layer WL and the AlGaN layer ML. The thickness of the intermediate layer SL is, for example, not more than 1 nm. The thickness of the intermediate layer SL is, for example, 0.5 nm. The intermediate layer SL, for example, may not be provided. In this case, the AlGaN layer ML may be provided in contact with the well layer WL.

In the light emitting layer EL, for example the p-side InGaN layer CLa and the AlGaN layer ML may be in contact. In this case, the light emitting layer EL does not include the p-side nitride including layer DLa, the n-side nitride including layer DLb, and the n-side InGaN layer CLb. InGaN, which has a long growth time, does not grow, so the growth time of the light emitting layer EL is short.

In the light emitting layer EL, for example the n-side InGaN layer CLb and the AlGaN layer ML may be in contact. In this case, the light emitting layer EL does not include, for example, the n-side nitride including layer DLb. In this way, the growth time can be shortened. Also, it is also possible to suppress removal of Al due to the time for switching the source gas.

Figure 2:
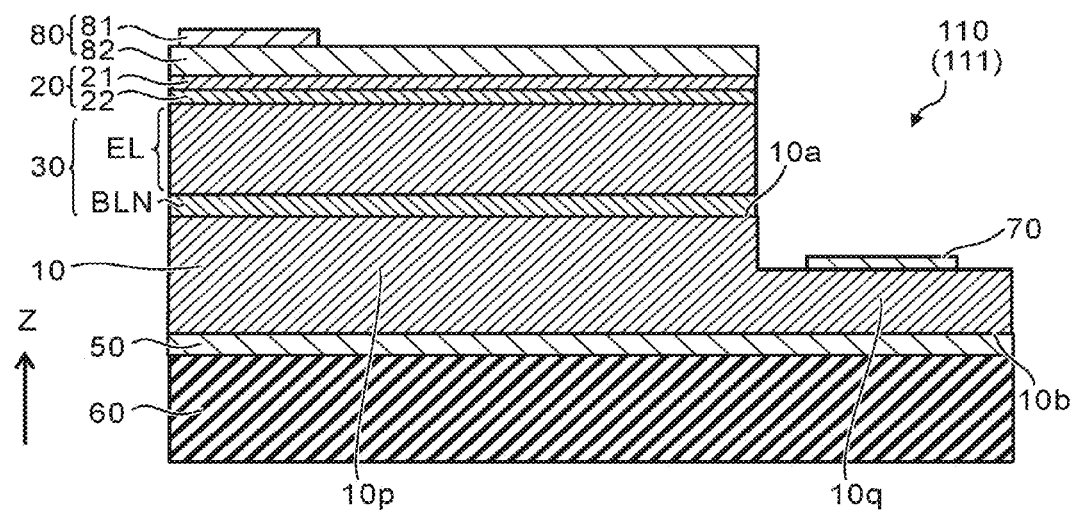
FIG. 2 is a schematic cross-sectional view illustrating the configuration of the semiconductor light emitting element according to the first embodiment.

FIG. 2 is a schematic cross-sectional view illustrating the configuration of the semiconductor light emitting element according to the first embodiment. As illustrated in FIG. 2, in this example, the semiconductor light emitting element 110 (semiconductor light emitting element 111) according to this embodiment further includes a substrate 60, a buffer layer 50, an n-side electrode 70, and a p-side electrode 80. For example, the n-type semiconductor layer 10 is provided between the substrate 60 and a light emitting unit 30. The buffer layer 50 is, for example, provided between the substrate 60 and the n-type semiconductor layer 10.

Sapphire, for example, is used for the substrate 60. For example, a sapphire (0001) substrate is used for the substrate 60. A SiC substrate, a Si substrate, or a GaN substrate may be used for the substrate 60.

A GaN layer, for example, is used for the buffer layer 50. For example, the n-type semiconductor layer 10, the light emitting unit 30, and the p-type semiconductor layer 20 are formed in that order on the buffer layer 50. The substrate 60 and the buffer layer 50 are provided when necessary, and may be omitted. After forming the semiconductor layers as described above on the buffer layer 50, the substrate 60 may be removed.

The n-type semiconductor layer 10 includes, for example, a first major surface 10a and a second major surface 10b. The first major surface 10a is, for example, the surface on the light emitting unit 30 side. The second major surface 10b is the surface on the opposite side to the first major surface 10a.

In this example, a portion of the n-type semiconductor layer 10 is exposed on the first major surface 10a side. The n-side electrode 70 is electrically connected to the n-type semiconductor layer 10 in the portion where the n-type semiconductor layer 10 is exposed. The n-side electrode 70 is, for example, disposed on the first major surface 10a side of the n-type semiconductor layer 10.

The n-type semiconductor layer 10 includes a first portion 10p and a second portion 10q. The second portion 10q is aligned with the first portion 10p in a direction that intersects the Z-axis direction. The p-type semiconductor layer 20 is separated from the first portion 10p in the Z-axis direction. The light emitting unit 30 is disposed between the first portion 10p and the p-type semiconductor layer 20.

The p-side electrode 80 is disposed, for example, on the p-type semiconductor layer 20.

The state of being provided on includes, in addition to the state of being directly provided on, the state in which another layer is inserted between the two.

In this example, the p-side electrode 80 includes a first p-side electrode portion 81 and a second p-side electrode portion 82. The second p-side electrode portion 82 is provided between the first p-side electrode portion 81 and the p-type semiconductor layer 20.

In this example, the p-type semiconductor layer 20 includes a first p-type layer 21 and a second p-type layer 22. The second p-type layer 22 is provided between the first p-type layer 21 and the light emitting unit 30.

When a voltage is applied between the n-side electrode 70 and the p-side electrode 80, a current is supplied to the light emitting unit 30 via the n-type semiconductor layer 10 and the p-type semiconductor layer 20. Light is emitted from the light emitting unit 30.

In one example, the peak wavelength $\lambda p$ of the light (luminescent light) emitted from the light emitting unit 30 is, for example, not less than 530 nanometers (nm). In another example, the peak wavelength $\lambda p$ of the luminescent light is, for example, not less than 530 nm and less than 570 nm. In another example, the peak wavelength $\lambda p$ of the luminescent light is, for example, not less than 570 nm and less than 600 nm. In another example, the peak wavelength $\lambda p$ of the luminescent light is, for example, not less than 600 nm and not more than 750 nm.

From this configuration, a high efficiency can be obtained. In the following, tests are described based on the construction of the configurations of the semiconductor light emitting element according to this embodiment.

First, an example of a manufacturing method of the semiconductor light emitting element 111 is described.

For example, a sapphire (0001) substrate 60 is thermally cleaned at a susceptor temperature of 1100° C. Next, the susceptor temperature is lowered to 500° C., and a buffer film that will serve as the buffer layer 50 is grown on the substrate 60. The buffer film is, for example, a GaN film.

The susceptor temperature is raised to, for example, 1120° C., and an n-type semiconductor film that will serve as the n-type semiconductor layer 10 is formed on the buffer film. The n-type semiconductor film is, for example, an n-type GaN film doped with Si.

An n-side barrier film that will serve as the n-side barrier layer BLN is formed on the n-type semiconductor film. The n-side barrier film is, for example, GaN doped with Si. The thickness of the n-side barrier film (n-side barrier layer BLN) is, for example, not less than 1 nm and not more than 50 nm, for example, 12.5 nm.

Then, the susceptor temperature is reduced to within the range of not less than 700° C. and not more than 800° C., and a first well film that will serve as the first well layer WL1 is formed. The first well film is, for example, an InGaN film.

The thickness of the first well film (first well layer WL1) is, for example, approximately 3 nm. The In composition ratio of the first well layer WL1 is, for example, approximately 0.23.

In this example, a first intermediate film that will serve as the first intermediate layer SL1 is formed on the first well layer WL1. The forming temperature of the first intermediate film (first intermediate layer SL1) is, for example, the same as the forming temperature of the first well layer WL1. The first intermediate film is, for example, a GaN film. The thickness of the first intermediate film is, for example, 0.5 nm.

Next, the susceptor temperature is raised to, for example, 890° C., and a first AlGaN film that will serve as the first AlGaN layer ML1 is formed. The thickness of the first AlGaN film (first AlGaN layer ML1) is, for example, 1 nm. The Al composition ratio of the first AlGaN layer ML1 is, for example, 0.3.

In this example, a first n-side nitride containing film that will serve as the first n-side nitride including layer DLb1 is formed on the first AlGaN layer ML1. The first n-side nitride including layer DLb1 is, for example, GaN. The thickness of the first n-side nitride including layer DLb1 is, for example 1 nm.

In this example, a first n-side InGaN film that will serve as the first n-side InGaN layer CLb1 is formed on the first n-side nitride including layer DLb1. The thickness of the first n-side InGaN film (first n-side InGaN layer CLb1) is, for example, 1 nm. The In composition ratio yb of the first n-side InGaN layer CLb1 is, for example, 0.01.

In addition, a first p-side nitride containing film that will serve as the first p-side nitride including layer DLa1 is formed on the first n-side InGaN layer CLb1. The first p-side nitride including layer DLa1 is, for example, GaN. The thickness of the first p-side nitride including layer DLa1 is, for example, 1 nm.

A first p-side InGaN film that will serve as the first p-side InGaN layer CLa1 is formed on the first p-side nitride including layer DLa1. The thickness of the first p-side InGaN film (first p-side InGaN layer CLa1) is, for example 1 nm. The In composition ratio ya of the first p-side InGaN layer CLa1 is, for example, 0.01.

The forming temperatures of the first n-side InGaN layer CLb1 and the first p-side InGaN layer CLa1 are, for example, greater than 810° C. and less than 905° C. For example, not less than 860° C. and not more than 890° C. For example, the forming temperature is the same as the forming temperature of the first AlGaN layer ML1. For example, the forming temperature of the first n-side nitride including layer DLb1 and the first p-side nitride including layer DLa1 is the same as the forming temperature of the first n-side InGaN layer CLb1 and the first p-side InGaN layer CLa1.

A first barrier film that will serve as the first barrier layer BL1 is formed on the first p-side InGaN layer CLa1. The first barrier film is, for example, GaN. The thickness of the first barrier film (first barrier layer BL1) is, for example, thicker than that of the first intermediate layer SL1, the first p-side nitride including layer DLa1, and the first n-side nitride including layer DLb1. The thickness of the first barrier film (first barrier layer BL1) is, for example, 4 nm. The forming temperature of the first barrier layer BL is, for example, 890° C.

In this way, the first light emitting layer EL1 is formed.

For example, the second light emitting layer EL2 to the fourth light emitting layer EL4 are formed in the same way as described above Thereby, the light emitting unit 30 is formed.

The p-type semiconductor layer 20, for example, is formed on the light emitting unit 30. In this example, a second p-type film that will serve as the second p-type layer 22 is formed on the light emitting unit 30. The second p-type film (second p-type layer 22) is, for example, GaN doped with Mg to a second concentration. A first p-type film that will serve as the first p-type layer 21 is formed on the second p-type layer 22. The first p-type film (first p-type layer 21) is, for example, GaN doped with Mg to a first concentration. The first concentration is, for example, higher than the second concentration.

The forming temperature of the second p-type layer 22 is, for example, 910° C. The thickness of the first p-type layer 21 is, for example, 80 nm. The forming temperature of the first p-type layer 21 is, for example, 910° C. The thickness of the first p-type layer 21 is, for example, 30 nm.

In this way, the p-type semiconductor layer 20 is formed.

Each of these layers can be grown using, for example, the metal organic chemical vapor deposition method (MOCVD), and the metal organic vapor phase epitaxy method (MOVPE), or the like.

The following can be used as the materials when forming each of the semiconductor layers.

For example, trimethylgallium (TMGa), triethylgallium (TEGa), and the like can be used as the raw material for Ga. For example, trimethylindium (TMIn), triethylindium (TEIn), and the like can be used as the raw material for In. For example, trimethyl aluminum (TMAl) and the like can be used as the raw material for Al. For example, ammonia ($NH_3$), mono methyl hydrazine (MMHy), di methyl hydrazine (DMHy) and the like can be used as the raw material for N. For example, mono silane ($SiH_4$) and the like can be used as the raw material for Si. For example, biscyclopentadienyl magnesium ($Cp_2Mg$) and the like can be used as the raw material for Mg.

Thereafter, a portion of the p-type semiconductor layer 20, a portion of the light emitting unit 30, and a portion of the n-type semiconductor layer 10 are removed by, for example, an etching process, to expose a portion of the n-type semiconductor layer 10.

For example, the n-side electrode 70 is formed on the exposed n-type semiconductor layer 10. For example, an electron beam deposition method can be used for forming the n-side electrode 70. For example, Ti/Pt/Au can be used for the n-side electrode 70.

For example, the p-side electrode 80 is formed on the p-type semiconductor layer 20. In this example, a second p-side electrode film that will serve as the second p-side electrode portion 82 is formed on the p-type semiconductor layer 20. For example, the sputtering method can be used for forming the second p-side electrode. The second p-side electrode portion 82 is, for example, an electrode with optical transparency. The second p-side electrode portion 82 includes, for example, an oxide that includes at least any element selected from the group consisting of In, Sn, Ga, and Ni. For example, Indium Tin Oxide (ITO) can be used. For example, a thin metal film with optical transparency may be used.

In this example, the first p-side electrode portion 81 is formed on the second p-side electrode portion 82. For example, the electron beam deposition method can be used for forming the first p-side electrode film. For example, Ti/Pt/Au can be used for forming the first p-side electrode portion 81.

In this way, the semiconductor light emitting element 111 is formed.

The following is a description of an example of the band structure of the light emitting layer EL of the semiconductor light emitting element 111.

Figure 3A:
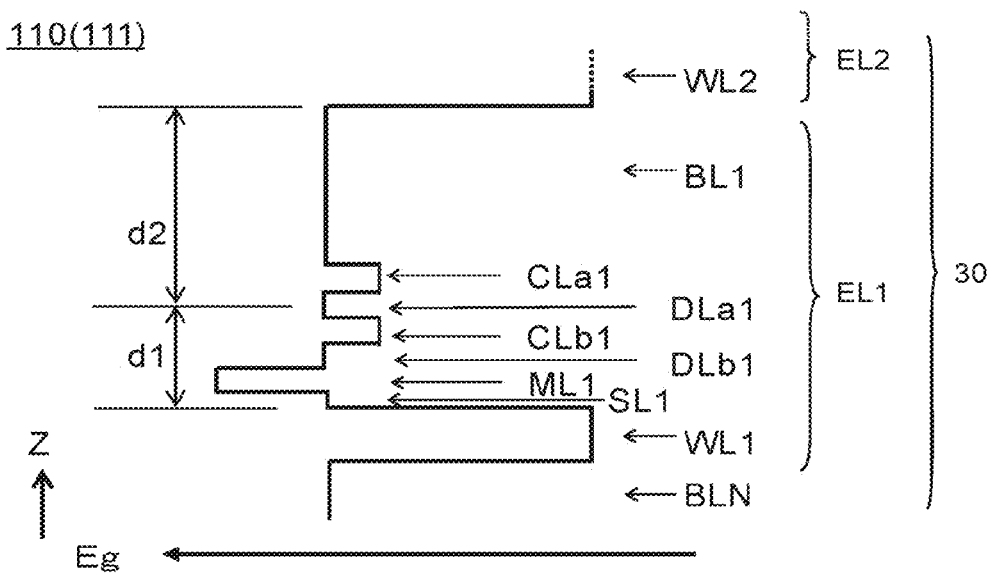
FIGS. 3A and 3B are schematic views illustrating the characteristics of the semiconductor light emitting element according to the first embodiment.
Figure 3B:
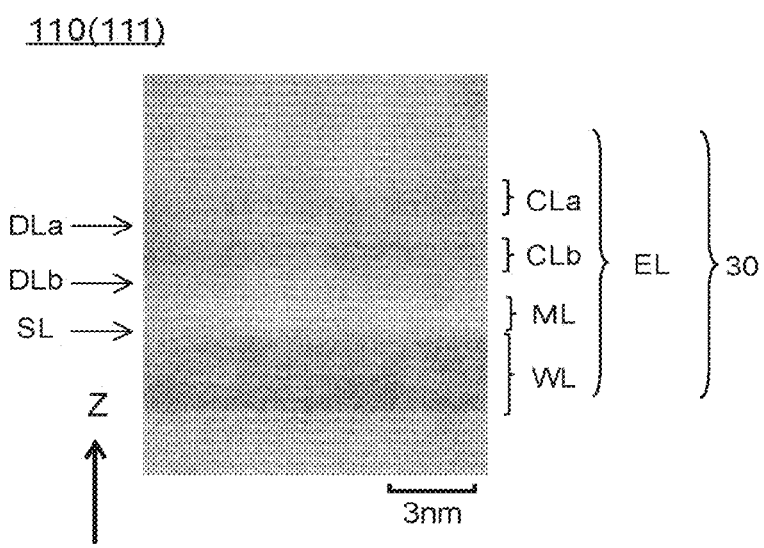

FIGS. 3A and 3B are schematic views illustrating the characteristics of the semiconductor light emitting element according to the first embodiment.

FIG. 3A illustrates an example of the energy band diagram of the first light emitting layer EL1 in the semiconductor light emitting element 110 (or the semiconductor light emitting element 111). In FIG. 3A, the horizontal axis represents the band gap energy Eg. The vertical axis represents the stacking direction (Z-axis direction) of the first light emitting layer EL1. FIG. 3B is a transmission electron microscope photographic image of the first light emitting layer EL1. FIG. 3B is an image of the cross-section of the semiconductor light emitting element 110 (or the semiconductor light emitting element 111).

The band gap energy Eg of the first well layer WL1 is low. The band gap energy Eg of the first AlGaN layer ML1 is high. The band gap energy Eg of the n-side barrier layer BLN and the first barrier layer BL1 is higher than that of the first well layer WL1, and lower than that of the first AlGaN layer ML1. The band gap energy Eg of the first p-side InGaN layer CLa1 and the first n-side InGaN layer CLb is higher than that of the first well layer WL1, and lower than that of the first barrier layer BL1. The band gap energy Eg of the first p-side nitride including layer DLa1, the first n-side nitride including layer DLb1, and the first intermediate layer SL1 is higher than that of the first well layer WL1, and lower than that of the first AlGaN layer ML1.

As shown in FIG. 3B, in the semiconductor light emitting element 110, in the light emitting layer EL (first light emitting layer EL1), the well layer WL, the AlGaN layer ML, the n-side InGaN layer CLb, and the p-side InGaN layer CLa are aligned in that order. In this example, the intermediate layer SL is provided between the well layer WL and the AlGaN layer ML. Also, the n-side nitride including layer DLb is provided between the AlGaN layer ML and the n-side InGaN layer CLb. In addition, the p-side nitride including layer DLa is provided between the n-side InGaN layer CLb and the p-side InGaN layer CLa. The efficiency of the semiconductor light emitting element 110 is high.

Next, an example of the characteristics of the semiconductor light emitting element according to this embodiment is described.

Figure 4:
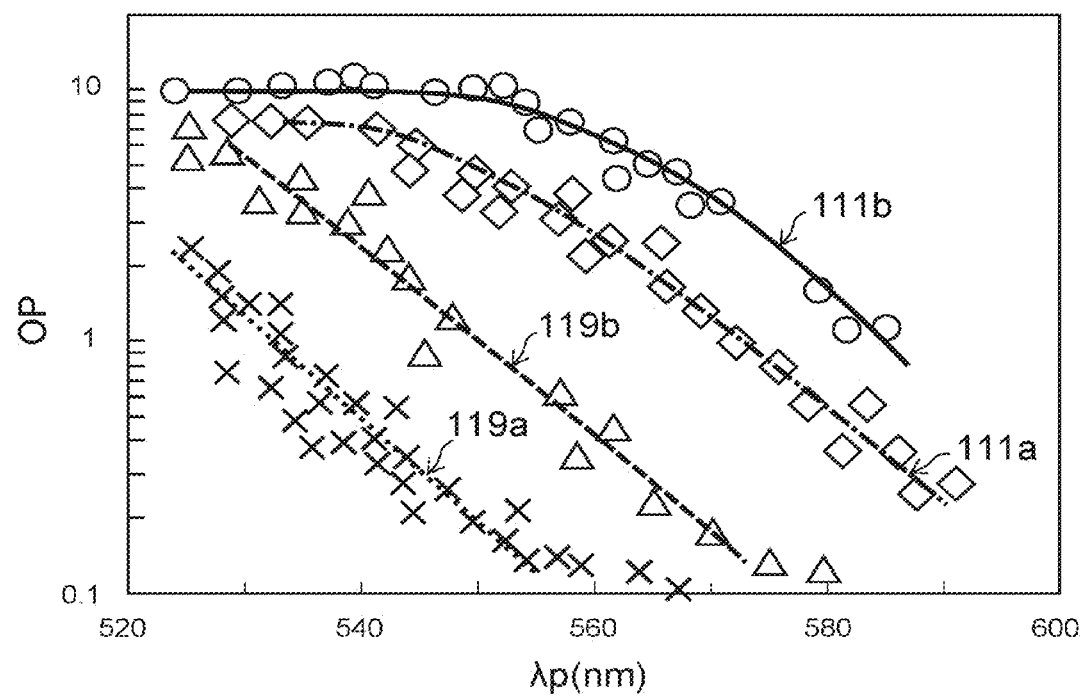
FIG. 4 is a graph showing the characteristics of a semiconductor light emitting element.

FIG. 4 is a graph showing the characteristics of a semiconductor light emitting element.

In FIG. 4, the horizontal axis is the peak wavelength $\lambda p$ (nm), and the vertical axis is the optical output OP. The optical output OP is the relative value of the light output when a current of 20 mA is flowing. In FIG. 4, data is shown for semiconductor light emitting elements 119a and 119b according to reference examples, in addition to semiconductor light emitting elements 111a and 111b according to this embodiment.

In the semiconductor light emitting element 111a, the forming temperature of the first p-side InGaN layer CLa1 and the first n-side InGaN layer CLb1 of the first light emitting layer EL1 was 840° C. Likewise for the second light emitting layer EL2 to the fourth light emitting layer EL4. Apart from this, the configuration of the semiconductor light emitting element 111a was the same as the configuration of the semiconductor light emitting element 111.

In the semiconductor light emitting element 111b, the forming temperature of the first p-side InGaN layer CLa1, and the first n-side InGaN layer CLb1 of the first light emitting layer EL1 was 890° C. Likewise for the second light emitting layer EL2 to the fourth light emitting layer EL4. Apart from this, the configuration of the semiconductor light emitting element 111b was the same as the configuration of the semiconductor light emitting element 111.

On the other hand, each light emitting layer EL of this semiconductor light emitting element 119a included the well layer WL and the barrier layer BL. In other words, the light emitting layer EL did not include the AlGaN layer ML and the InGaN layer. Apart from this, the configuration of the semiconductor light emitting element 119a was the same as the configuration of the semiconductor light emitting element 111.

Each light emitting layer EL of the semiconductor light emitting element 119b included the well layer WL, the AlGaN layer ML, and the barrier layer BL. In other words, the light emitting layer EL did not include the InGaN layer CL. Apart from this, the configuration of the semiconductor light emitting element 119b was the same as the configuration of the semiconductor light emitting element 111.

As shown in FIG. 4, as the peak wavelength 2p increases, the optical output OP reduces for the semiconductor light emitting elements 111a and 111b and for the semiconductor light emitting elements 119a and 119b of the reference example. In the semiconductor light emitting element 119a that did not include the AlGaN layer ML and the InGaN layer CL, when the peak wavelength $\lambda p$ is longer than 520 nm, the optical output OP is significantly reduced.

In the semiconductor light emitting element 119b in which the light emitting layer EL includes the AlGaN layer ML, the optical output OP is higher than that of the semiconductor light emitting element 119a. This is because, for example, the reduction in luminous efficiency due to the quantum confined Stark effect is suppressed by providing the AlGaN layer ML in the light emitting layer EL. This effect is significant when, for example, the peak wavelength 4 is not less than 520 nm.

On the other hand, in the semiconductor light emitting elements 111a and 111b according to this embodiment, the light emitting layer EL includes the AlGaN layer ML and the InGaN layer. The optical output OP of the semiconductor light emitting elements 111a and 111b is even higher than the optical output OP of the semiconductor light emitting element 119b. In other words, efficiency is high. This effect is particularly significant when, for example, the peak wavelength $\lambda p$ is not less than 530 nm.

The reason that high optical output OP can be obtained in the semiconductor light emitting elements 111a and 111b according to this embodiment is considered to be as follows.

In the semiconductor light emitting element, the lattice spacing of the well layer WL is wide compared with the other layers, so strain occurs, and a piezo electric field is generated. As a result of this piezo electric field, the integrated value of the overlap in the electron hole wave function and the electron wave function is reduced, so the luminous efficiency is reduced. In particular, in well layers with long wavelengths greater than 530 nm, large strain occurs, so this tendency is significant.

By providing the first AlGaN layer ML1, the reduction in luminous efficiency due to the quantum confined Stark effect as described above is suppressed. However, when a layer that includes Al is provided in the light emitting layer EL (for example, AlGaN layer ML), it is considered that strain is introduced and piezo electric fields are easily generated.

For example, in order to suppress the Stark effect, for example, in the first light emitting layer EL1, it is effective to increase the Al composition ratio x1 in the first AlGaN layer ML1 to, for example, not less than 0.15. However, in this case, a large strain is induced in the well layer WL1.

If the next layer, for example, the second well layer WL2 of the second light emitting layer EL2 is grown while this strain remains, misfit dislocations are generated in the second well layer WL2.

In contrast, in the semiconductor light emitting elements 111a and 111b, the first p-side InGaN layer CLa1 is provided within the first light emitting layer ELl. By providing the first p-side InGaN layer CLa1, the misfit dislocations are generated within the first p-side InGaN layer CLa1, for example. For example, it is possible to suppress the occurrence of defects such as misfit dislocations and the like in the second well layer WL2. In this way, it is considered that it is possible to obtain even higher efficiency.

Normally, in order to reduce lattice mismatch, the average In composition within the light emitting layer EL is designed to be low. In contrast, in the semiconductor light emitting element according to this embodiment, by providing a layer that includes In within the light emitting layer EL, it is possible to obtain high efficiency, even though the average In composition ratio increases.

By setting the forming temperature of the p-side InGaN layer CLa and the n-side InGaN layer CLb to, for example, not less than 860° C. and not more than 890° C., it is possible to obtain higher efficiency. This is considered to be because, for example, the supply of raw material atoms to the surface during growth is made more uniform.

In the semiconductor light emitting elements 111a and 111b, each of the light emitting layers EL includes two thin InGaN layers CL (p-side InGaN layer CLa and n-side InGaN layer CLb), and two nitride including layers DL (p-side nitride including layer DLa).

Each light emitting layer EL may also include one InGaN layer CL. On the other hand, for example, if the number of InGaN layers CL and nitride including layers DL in each light emitting layer EL is large, and if the thickness of each light emitting layer EL becomes too thick, the average In composition becomes larger, and, on the contrary, the efficiency can be reduced. Preferably, the number of InGaN layers CL included in each light emitting layer EL is, for example, about two.

As illustrated in FIG. 3A, in the semiconductor light emitting elements 111a and 111b, a first distance d1 between the first p-side InGaN layer CLa1 and the first n-side InGaN layer CLb1 and the first well layer WL1 is, for example, shorter than a second distance d2 between the first p-side InGaN layer CLa1 and the first n-side InGaN layer CLb1 and the second well layer WL2. The first distance d1 may also be longer than the second distance d2. The first distance d1 may be the same as the second distance d2.

The first distance d1 and the second distance d2 main, for example, be determined by the thickness of each layer (first intermediate layer SL1, first AlGaN layer ML1, first n-side nitride including layer DLb1, first n-side InGaN layer CLb1, first p-side nitride including layer DLa1, first p-side InGaN layer CLa1, first barrier layer BL1). Examples of the thicknesses of each of these layers are described later.

In the semiconductor light emitting elements 111a and 111b, all of the first light emitting layer EL1 to the fourth light emitting layer EL4 include the AlGaN layer ML and the InGaN layer CL. If the light emitting unit 30 includes a plurality of light emitting layers EL, the AlGaN layer ML and the InGaN layer CL are provided in at least one light emitting layer EL. In this case, preferably, the light emitting layer EL located close to the p-type semiconductor layer 20 (for example, the first light emitting layer EL1) is provided with the AlGaN layer ML and the InGaN layer CL. In a light emitting layer with high hole injection efficiency (the light emitting layer close to the p-type semiconductor layer 20), the above effect can be obtained, so high efficiency can be easily obtained.

Figure 5A:
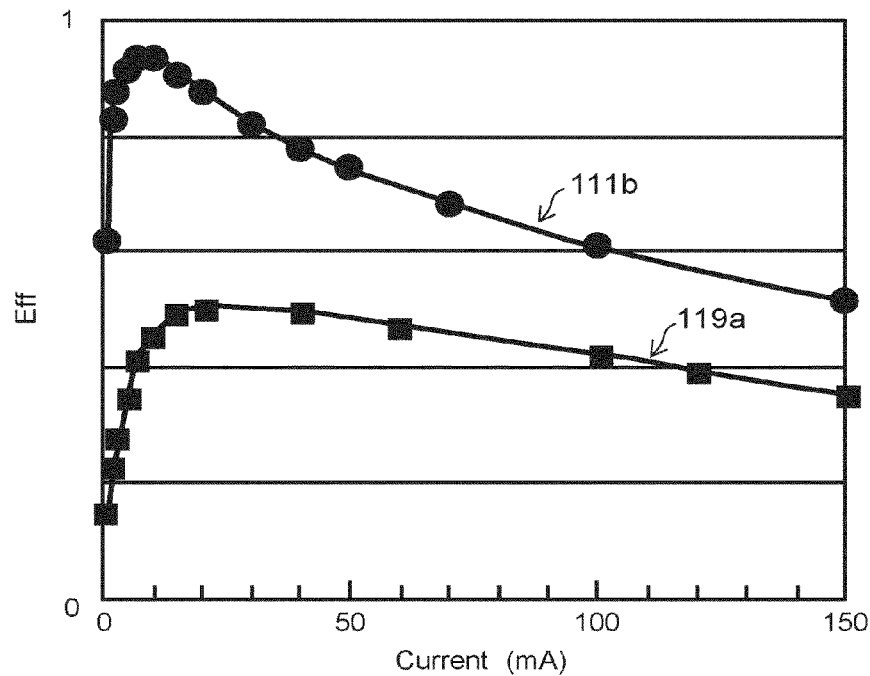
FIGS. 5A and 5B are graphs showing the characteristics of semiconductor light emitting elements.
Figure 5B:
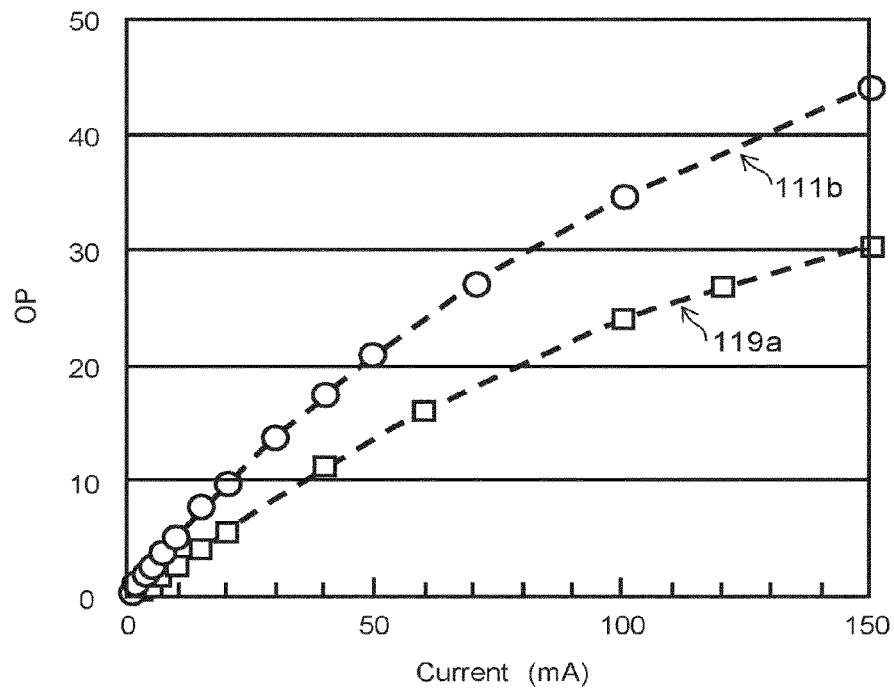

FIGS. 5A and 5B are graphs showing the characteristics of semiconductor light emitting elements.

FIG. 5A shows the efficiency Eff of the semiconductor light emitting element 111b according to this embodiment and the semiconductor light emitting element 119a according to a reference example. In FIG. 5A, the horizontal axis is current (mA). The vertical axis is the relative luminous efficiency Eff at a wavelength of 550 nm.

FIG. 5B shows the efficiency Eff of the semiconductor light emitting element 111b according to this embodiment and the semiconductor light emitting element 119b according to a reference example. In FIG. 5B, the horizontal axis is current (mA). The vertical axis is the relative optical output OP (at the wavelength of 550 nm).

As shown in FIGS. 5A and 5B, in the semiconductor light emitting element 111b, the relative luminous efficiency Eff and the relative optical output OP are higher than for the semiconductor light emitting element 119b.

Figure 6:
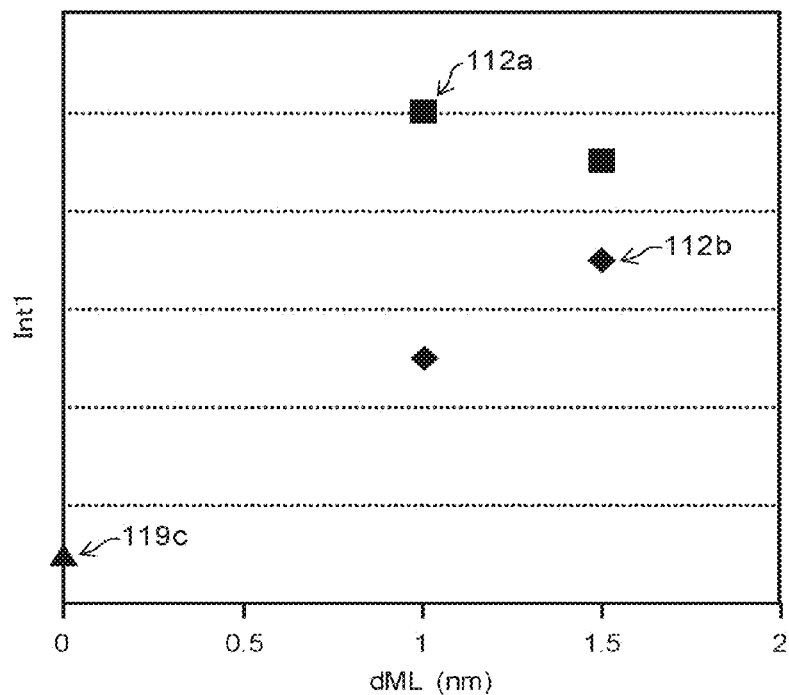
FIG. 6 is a graph showing the characteristics of a semiconductor light emitting element.

FIG. 6 is a graph showing the characteristics of a semiconductor light emitting element.

FIG. 6 shows the relative EL intensity when the thickness dML of the AlGaN layer ML is varied. In FIG. 6, the horizontal axis is the thickness dML (nm) of the AlGaN layer ML. The vertical axis is the relative EL intensity Int1 at the wavelength of 550 nm. In FIG. 6, data is shown for a semiconductor light emitting element 119c according to a reference example, in addition to data for semiconductor light emitting elements 112a and 112b according to this embodiment.

In the semiconductor light emitting element 112a, the configuration that was explained for the semiconductor light emitting element 111b is applied. The Al composition ratio x of the AlGaN layer ML included in the light emitting layer EL of the semiconductor light emitting element 112a is 0.3. The configuration of the semiconductor light emitting element 112b is the same as that of the semiconductor light emitting element 112a, except that the Al composition ratio x of each of the AlGaN layers ML is 0.15. The configuration of the semiconductor light emitting element 119c is the same as that of the semiconductor light emitting element 112a, except that the Al composition ratio x of each of the AlGaN layers ML is 0.

As shown in FIG. 6, the relative EL intensity of the light emitting layer EL is high when the AlGaN layer ML is included.

Figure 7:
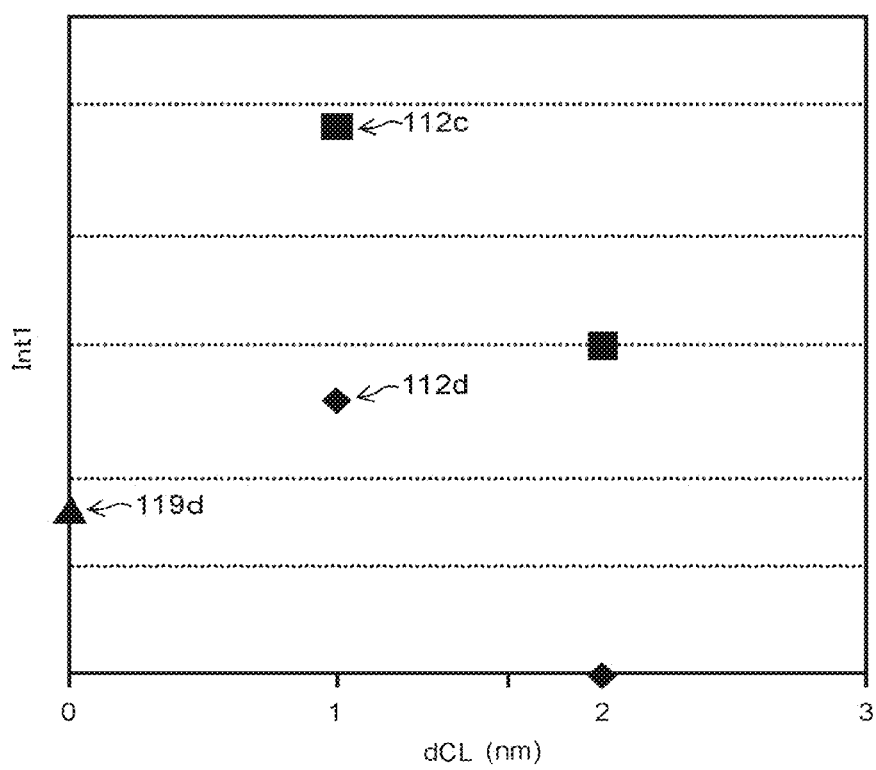
FIG. 7 is a graph showing the characteristics of a semiconductor light emitting element.

FIG. 7 is a graph showing the characteristics of a semiconductor light emitting element.

In FIG. 7, the relative EL intensity is shown when the thickness dCL of each InGaN layer CL is varied. In FIG. 7, the horizontal axis is the thickness dCL (nm) of each InGaN layer CL. The vertical axis is the relative EL intensity Int1 at the wavelength of 550 nm. In FIG. 7, data is shown for a semiconductor light emitting element 119d according to a reference example, in addition to data for semiconductor light emitting elements 112c and 112d according to this embodiment.

In the semiconductor light emitting element 112c, the In composition ratio ya of the p-side InGaN layer CLa and the In composition ratio yb of the n-side InGaN layer CLb are each 0.01. Apart from this, the configuration is the same as that of the semiconductor light emitting element 111b. In the semiconductor light emitting element 112d, the In composition ratio ya of the p-side InGaN layer CLa and the In composition ratio yb of the n-side InGaN layer CLb are each 0.05, and apart from this, the configuration is the same as that of the semiconductor light emitting element 112c. In the semiconductor light emitting element 119d, the In composition ratio ya of the p-side InGaN layer CLa and the In composition ratio yb of the n-side InGaN layer CLb are each 0, and apart from this, the configuration is the same as that of the semiconductor light emitting element 112c.

As shown in FIG. 7, when the thickness of the InGaN layers CL, in other words, when the thickness of the p-side InGaN layer CLa and the n-side InGaN layer CLb are each 1 nm, the relative EL intensity of the light emitting layer EL is higher than that of the semiconductor light emitting element 119d that does not include the InGaN layer CL.

In the semiconductor light emitting element 112c, the In composition ratio y of the InGaN layer CL is low at 0.01. In the semiconductor light emitting element 112c, the relative EL intensity is high, even when the thickness of each InGaN layer CL is 2 nm.

In the semiconductor light emitting element 112d, the In composition ratio y of the InGaN layer CL is 0.05, which is higher than that of the semiconductor light emitting element 112c. In the semiconductor light emitting element 112d, when the thickness of each InGaN layer is thick at 2 nm, the relative EL intensity is lower than that of the semiconductor light emitting element 119d. When the In composition ratio y is high at 0.05, preferably, the thickness of each InGaN is less than 2 nm.

Figure 8:
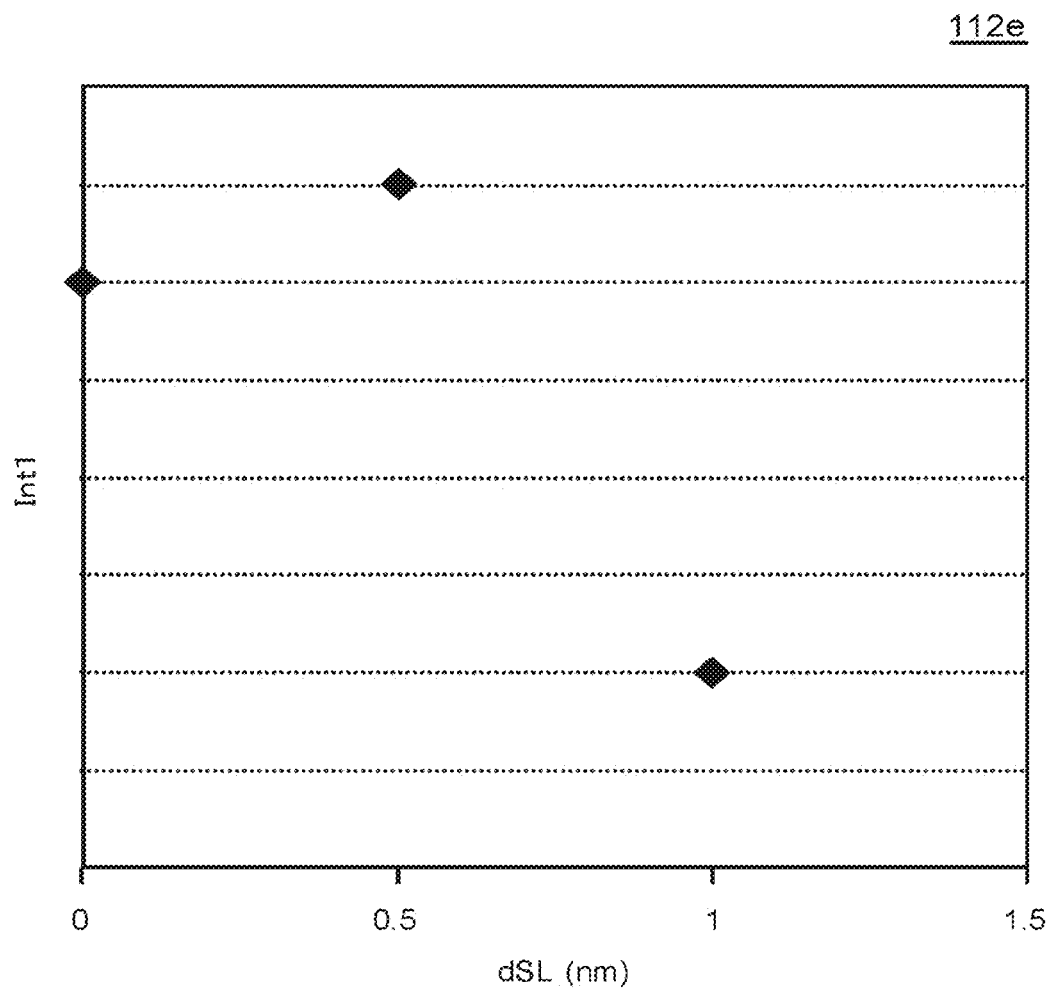
FIG. 8 is a graph showing the characteristics of a semiconductor light emitting element.
Figure 9A:
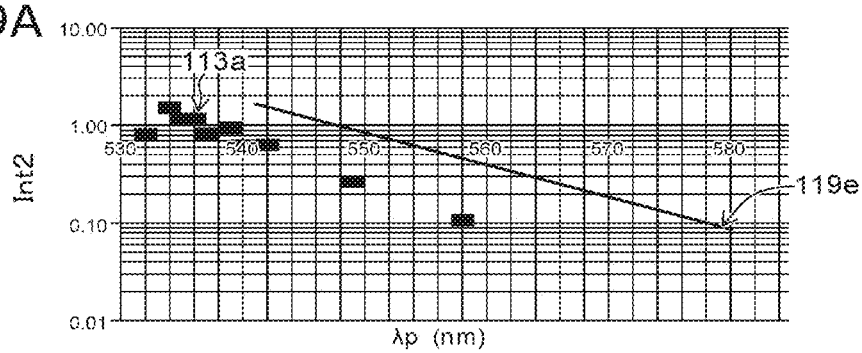
FIGS. 9A to 9D are graphs showing the characteristics of a semiconductor light emitting element according to the first embodiment.
Figure 9B:
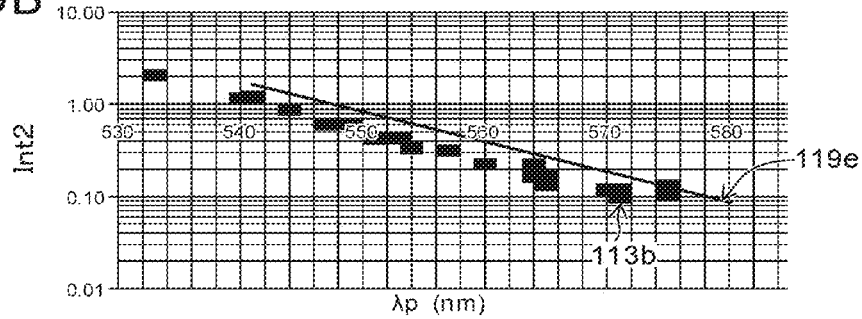
Figure 9C:
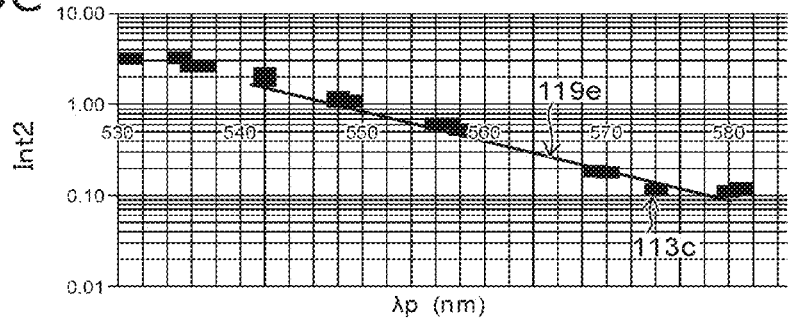
Figure 9D:
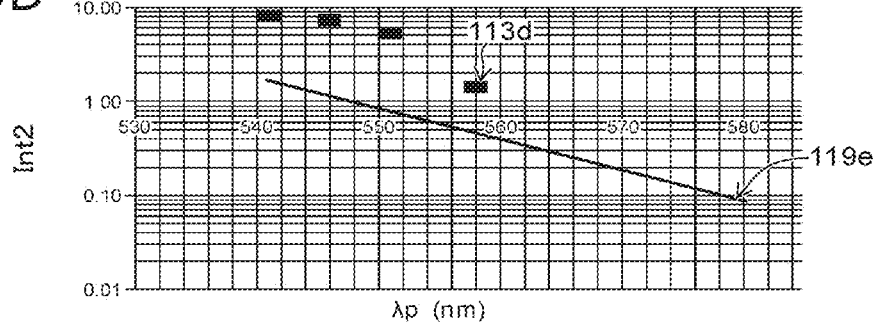

FIG. 8 is a graph showing the characteristics of a semiconductor light emitting element.

FIG. 8 shows the relative EL intensity of a semiconductor light emitting element 112e according to this embodiment when the thickness dSL of the intermediate layer SL is varied. In FIG. 8, the horizontal axis is the thickness dSL (nm) of the intermediate layer SL. The vertical axis is the relative EL intensity Int1 at the wavelength of 550 nm. The thickness dSL of the intermediate layer SL is equivalent to the distance between the well layer WL1 and the AlGaN layer ML. In the semiconductor light emitting element 112e, the Al composition ratio x in the AlGaN layer ML is 0.3. Apart from this, the configuration is the same as that of the semiconductor light emitting element 111b.

As shown in FIG. 8, when the thickness dSL of the intermediate layer SL is not less than 1 nm, the relative EL intensity is reduced. The thickness dSL of the intermediate layer SL is, for example, not more than 2 nm. Preferably, the thickness dSL of the intermediate layer SL is, for example, not more than 1 nm. The intermediate layer SL, for example, may not be provided.

FIGS. 9A to 9D are graphs showing the characteristics of a semiconductor light emitting element according to the first embodiment.

FIGS. 9A to 9D show examples of the luminous intensity when the Al composition ratio x of the AlGaN layer ML included in the light emitting layer EL is varied. In FIGS. 9A to 9D, the horizontal axis is the peak wavelength λp (nm) in each case. The vertical axis is the luminous intensity Int1. In FIG. 9A to 9D, data is shown for a semiconductor light emitting element 119e that does not include the AlGaN layer ML.

In a semiconductor light emitting element 113a, the Al composition ratio x of the AlGaN layer ML is 0.09. Apart from this, the configuration is the same as that of the semiconductor light emitting element 111b.

In a semiconductor light emitting element 113b, the Al composition ratio x of the AlGaN layer ML is 0.13, and apart from this, the configuration is the same as that of the semiconductor light emitting element 113a.

In a semiconductor light emitting element 113c, the Al composition ratio x of the AlGaN layer ML is 0.18, and apart from this, the configuration is the same as that of the semiconductor light emitting element 113a.

In a semiconductor light emitting element 113d, the Al composition ratio x of the AlGaN layer ML is 0.30, and apart from this, the configuration is the same as that of the semiconductor light emitting element 113a.

As shown in FIGS. 9A to 9D, when the Al composition ratio x is 0.09 or 0.13, the luminous intensity is lower than that of the semiconductor light emitting element 119e. On the other hand, in the semiconductor light emitting elements 113c and 113d, the luminous intensity is higher than that of the semiconductor light emitting element 119e.

The Al composition ratio is, for example, set appropriately in accordance with the peak wavelength λp. For example, in the case of green light (peak wavelength λp of, for example, 500 to 570 nm), the Al composition ratio x is not less than 0.25 and not more than 0.6. Thereby, high efficiency can be obtained. For example, in the case of yellow light (peak wavelength λp of, for example, 570 to 600 nm), the Al composition ratio x is not less than 0.3 and not more than 0.8. Thereby, high efficiency can be obtained. For example, in the case of red light (peak wavelength λp of, for example, 600 to 750 nm), the Al composition ratio x is not less than 0.4 and not more than 1. Thereby, high efficiency can be obtained.

Figure 10:
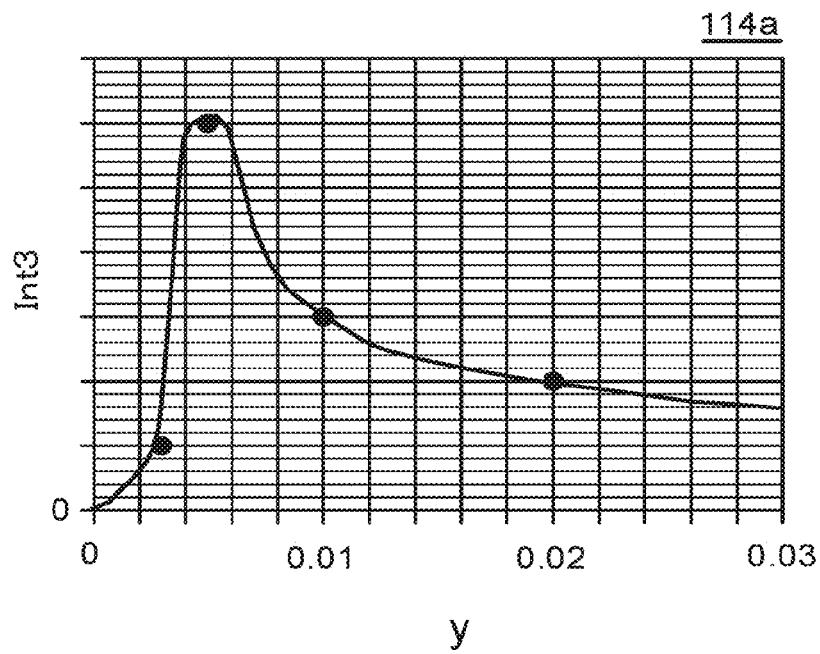
FIG. 10 is a graph showing the characteristics of the semiconductor light emitting element according to the first embodiment.

FIG. 10 is a graph showing the characteristics of the semiconductor light emitting element according to the first embodiment.

FIG. 10 shows an example of the relative luminous intensity in a semiconductor light emitting element 114a when the In composition ratio y in each InGaN layer CL (p-side InGaN layer CLa and n-side InGaN layer CLb) in the light emitting layer EL is varied. In FIG. 10, the horizontal axis is the In composition ratio y in each InGaN layer CL. The vertical axis is the relative luminous intensity Int3 at the wavelength of 550 nm. In the semiconductor light emitting element 114a, the Al composition ratio x of the AlGaN layer ML included in the light emitting layer EL is 0.25. In the semiconductor light emitting element 114a, the thicknesses of the p-side InGaN layer CLa and the n-side InGaN layer CLb are each 1 nm. In the semiconductor light emitting element 114a, the configuration apart from this is the same as that of the semiconductor light emitting element 111b.

As shown in FIG. 10, the relative luminous intensity is increased by providing the InGaN layer. If the In composition ratio y in each InGaN layer CL is greater than 0.1, the effect of providing the InGaN layer CL is reduced. The In composition ratio y in each InGaN layer CL is, for example, greater than 0 and not more than 0.1. The In composition ratio y in each InGaN layer CL is, for example, not less than 0.002 and not more than 0.05. The In composition ratio y in each InGaN layer CL is, for example, not less than 0.003 and not more than 0.03. Thereby, high efficiency can be obtained.

Figure 11:
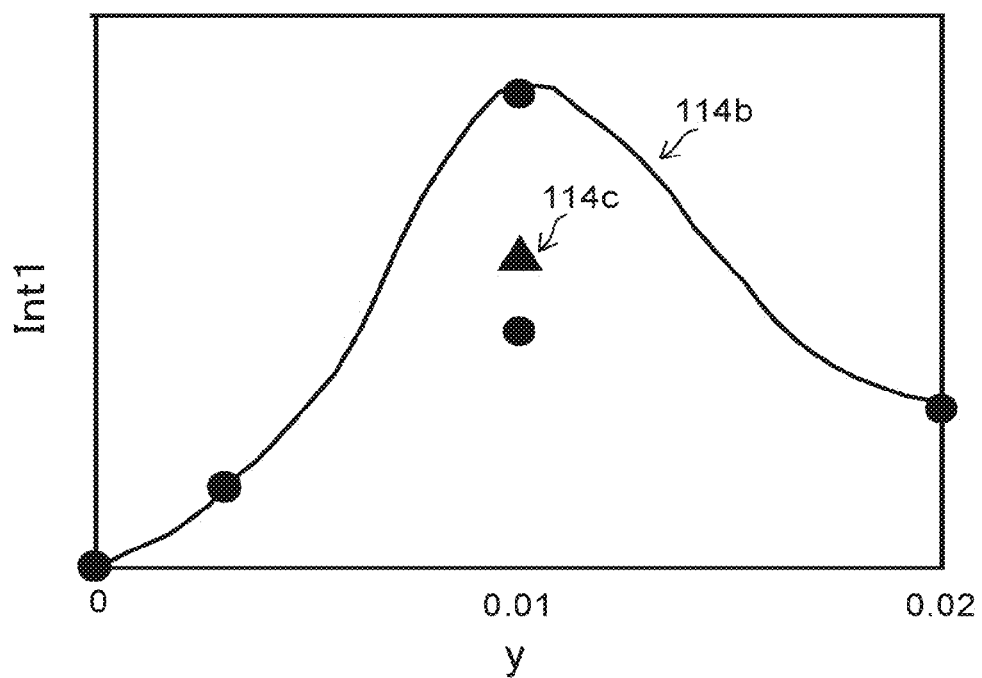
FIG. 11 is a graph showing the characteristics of the semiconductor light emitting element according to the first embodiment.

FIG. 11 is a graph showing the characteristics of the semiconductor light emitting element according to the first embodiment.

FIG. 11 shows an example of the relative EL intensity in semiconductor light emitting elements 114b and 114c when the In composition ratio y in each InGaN layer CL (p-side InGaN layer CLa and n-side InGaN layer CLb) in the light emitting layer EL is varied. In FIG. 11, the horizontal axis is the In composition ratio y in each InGaN layer CL. The vertical axis is the relative EL intensity Int1 at the wavelength of 580 nm.

The Al composition ratio x of the AlGaN layer ML included in the light emitting layer EL of the semiconductor light emitting element 114a is 0.25. In the semiconductor light emitting element 114b, the total of the thicknesses of the p-side InGaN layer CLa and the n-side InGaN layer CLb is 2 nm. In the semiconductor light emitting element 114b, the configuration apart from this is the same as that of the semiconductor light emitting element 111b. In this semiconductor light emitting element 114c, the total of the thicknesses of the p-side InGaN layer CLa and the n-side InGaN layer CLb is 3 nm, and apart from this, the configuration is the same as that of the semiconductor light emitting element 114b.

As can be seen from FIG. 11, in the semiconductor light emitting elements 114b and 114c, the efficiency is high.

In this embodiment, the Al composition ratio x and the In composition ratio y can be measured by a method such as energy dispersive x-ray spectrometry (EDX) or the like. A structure analysis method using a secondary ion microprobe mass spectrometer (SIMS) or an omega-2 theta scan using an x-ray diffraction device can be used.

The thickness of crystal layers such as the AlGaN layer ML, the InGaN layer CL or the like can be obtained from, for example, an electron microscope photographic image of a cross-section of the crystal layer, or the like.

The AlGaN layer ML is, for example, in layer form. The InGaN layer CL may be in layer form, or may be in mesh form. In the mesh form, openings are provided. If the InGaN layer CL is in layer form, for example, the high-efficiency effect as described above is easily obtained. If the InGaN layer CL is in mesh form, for example, the high efficiency effect as well as a reduction in operating voltage effect are easily obtained.

Second Embodiment

This embodiment relates to a method for manufacturing the semiconductor light emitting element. To this manufacturing method, for example, the method for manufacturing the semiconductor light emitting element 111 as already described or the like can be applied.

Figure 12:
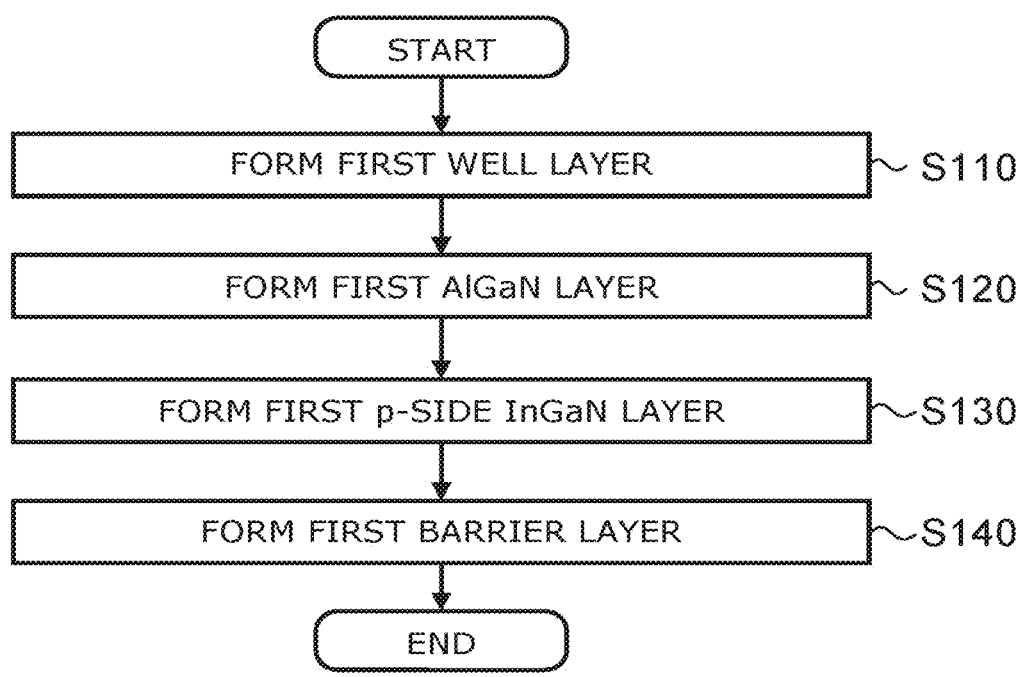
FIG. 12 is a flowchart illustrating a manufacturing method of a semiconductor light emitting element according to the second embodiment.

FIG. 12 is a flowchart illustrating a manufacturing method of a semiconductor light emitting element according to the second embodiment.

The method for manufacturing the semiconductor light emitting element according to this embodiment includes a process of forming the first well layer WL1 in contact with the n-side barrier layer BLN provided on the n-type semiconductor layer 10 which includes semiconductor nitride (step S110). In this process, the first well layer WL1 is formed at a first temperature T1.

This manufacturing method further includes a process of forming the first AlGaN layer ML1 on the first well layer WL1, including $Al_{x1}Ga_{1-x1}N$ ($0.15 \leq x1 \leq 1$) (step S120). In this process, the first AlGaN layer ML1 is formed at a second temperature T2. This manufacturing method further includes a process of forming the first p-side InGaN layer CLa1 on the first AlGaN layer ML1, including $In_{ya1}Ga_{1-ya1}N$ ($0 < ya1 \leq 0.1$) (step S130). In this process, the first p-side InGaN layer CLa1 is formed at a third temperature T3. This manufacturing method further includes a process of forming the first barrier layer BL on the first p-side InGaN layer CLa1 (step S140). In this process, the first barrier layer BL1 is formed at a fourth temperature T4.

The fourth temperature T4 is, for example, higher than the first temperature T1. The difference between the fourth temperature T4 and the first temperature T1 is, for example, not less than 50° C.

The second temperature T2 is, for example, the same as the fourth temperature T4. The third temperature T3 is, for example, the same as the fourth temperature T4.

The first temperature T1 is, for example, not less than 700° C. and not more than 800° C. The second temperature T2, the third temperature T3, and the fourth temperature T4 are, for example, not less than 50° C. higher than the first temperature T1. The second temperature T2, the third temperature T3, and the fourth temperature T4 are, for example, not less than 810° C. and not more than 905° C. The second temperature T2, the third temperature T3, and the fourth temperature T4 are, for example, not less than 860° C. and not more than 890° C.

According to the manufacturing method according to this embodiment, it is possible to provide a method for manufacturing a semiconductor light emitting element with high efficiency.

Third Embodiment

Figure 13A:
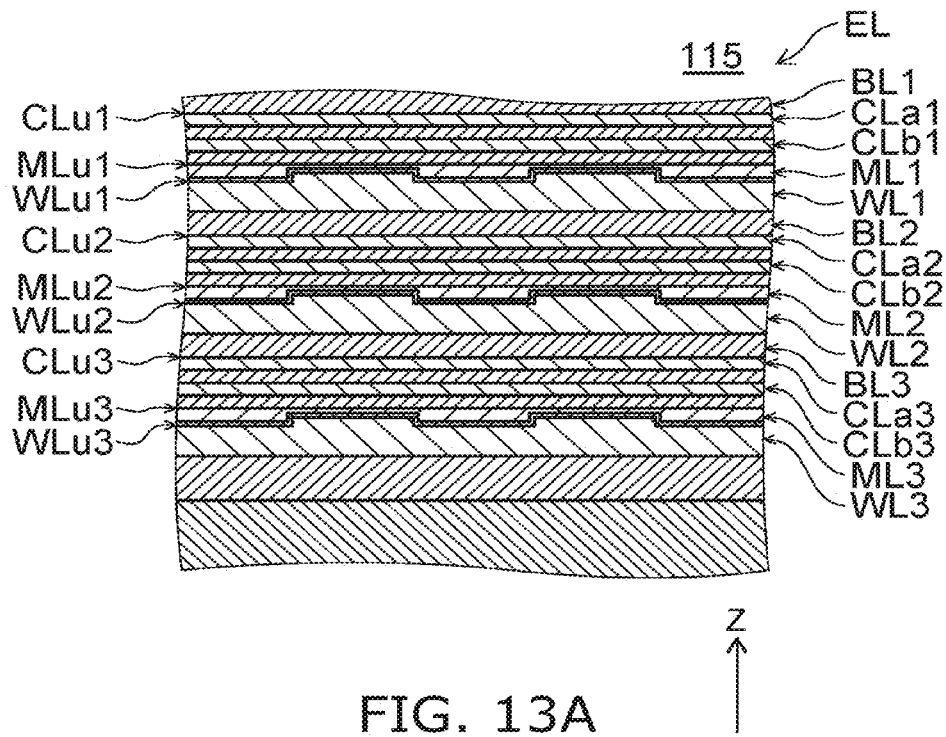
FIG. 13A and FIG. 13B are schematic views illustrating a semiconductor light emitting element according to a third embodiment.
Figure 13B:
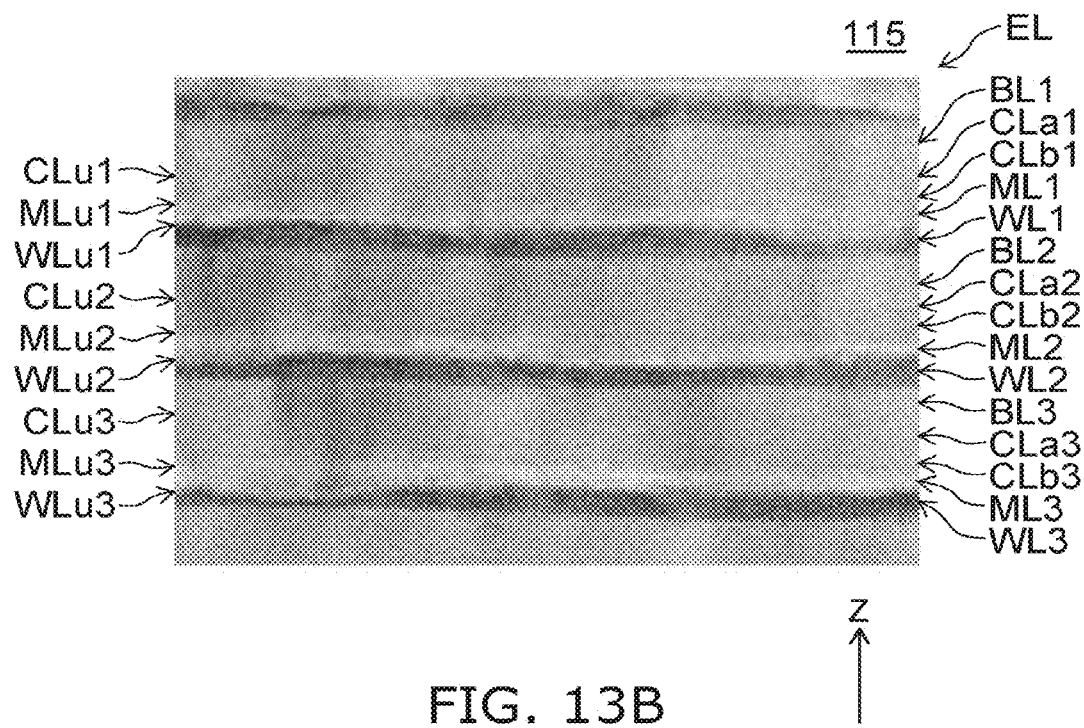

FIG. 13A and FIG. 13B are schematic views illustrating a semiconductor light emitting element according to a third embodiment.

FIG. 13A is a schematic cross-sectional view illustrating a semiconductor light emitting element 115 according to this embodiment. As illustrated in FIG. 13A, the n-type semiconductor layer 10, the p-type semiconductor layer 20, and the light emitting unit 30 are provided in the semiconductor light emitting element 115. The n-side barrier layer BLN and the light emitting layer EL are provided in the light emitting unit 30. The well layer WL, the AlGaN layer ML, the n-side InGaN layer CUD, the p-side InGaN layer CLa, and the barrier layer BL are provided in the light emitting layer EL. These layers are stacked in sequence. The configurations and materials described for the first embodiment are applied to the n-type semiconductor layer 10, the p-type semiconductor layer 20, the n-side barrier layer BLN, the well layer WL, the n-side InGaN layer CLb, the p-side InGaN layer CLa, and the barrier layer BL. In the semiconductor light emitting element 115, the Al composition ratio x in the AlGaN layer ML is 0.5≤x≤1.

FIG. 13B is a transmission electron microscope photographic image of a cross-section parallel to the Z-axis direction of the light emitting layer EL.

In FIG. 13B, the portions where the concentration (brightness) is high (dark) corresponds to the well layer WL. In the image, the portions where the concentration is low (bright), corresponds to the AlGaN layer ML. The portion with the intermediate concentration between the i-th AlGaN layer ML and the (i+1)-th well layer WL(i+1) corresponds to the i-th barrier layer BLi, the i-th p-side InGaN layer CLai, and the i-th n-side InGaN layer CLb ("i" is an integer 1 or greater).

Irregularities are formed on the well layer WL, so the thickness of the well layer WL varies spatially. For example, the upper surface WLui of the i-th well layer WLi (for example, the surface of the first well layer WL1 on the first AlGaN layer side) has irregularities.

The AlGaN layer ML also has irregularities, and the thickness of the AlGaN layer ML varies spatially (there are fluctuations in the thickness). For example, the upper surface MLui of the i-th AlGaN layer MLi (for example, the surface of the first AlGaN layer ML1 on the first p-side InGaN layer CLa1 side) has irregularities. In FIG. 13B, light and shade can be seen in the portion of the image corresponding to the AlGaN layer ML. In a transmission electron microscope photograph, average information for the depth direction of the test material can be seen. Therefore, the light and shade of the image in the transmission electron microscope photograph reflects the variation in the thickness.

On the other hand, the upper surface CLui of the i-th InGaN layer CLi (for example, the surface of the first p-side InGaN layer CLa1 on the first barrier layer BL1 side) is flatter than the surface MLui. The InGaN layer CL is, for example, in layer form.

FIGS. 14A to 14F are schematic views illustrating the semiconductor light emitting element according to this embodiment.

FIGS. 14A to 14F are atomic force microscope (AFM) images of test material after forming the first AlGaN layer ML1, and before forming the other layers of the light emitting layer EL. In these AFM images, the surface of the first AlGaN layer ML1 (the surface perpendicular to the Z-axis direction) is viewed along the Z-axis direction.

FIGS. 14A to 14C correspond to the semiconductor light emitting elements 115a, 115b, and 112a, respectively. The configuration as described for the semiconductor light emitting element 115 is applied to the semiconductor light emitting elements 115a and 115b. In the semiconductor light emitting elements 115a, 115b, and 112a, the Al composition ratios x of the AlGaN layer ML are 0.9, 0.5, and 0.3, respectively. In the semiconductor light emitting element 112a, the first AlGaN layer ML1 is, for example, formed by step flow growth. Apart from the AlGaN layer ML, the same configurations have been applied to the semiconductor light emitting elements 115a, 115b, and 112a.

As can be seen from FIGS. 14A and 14B, in the semiconductor light emitting elements 115a and 115b, speckled light and shade can be seen on the surface of the first AlGaN layer ML1. This speckled light and shade corresponds to steps on the surface of the first AlGaN layer ML1. The magnitude (light and shade) of the steps corresponds to the number corresponding to the number of atomic steps in forming the film (magnitude of irregularities). The surfaces of the first AlGaN layer ML1 of the semiconductor light emitting elements 115a and 115b have irregularities. The root mean square (RMS) of the variation in the thickness of the AlGaN layer ML in the semiconductor light emitting element 115a is, for example, about 2.2 nm. The RMS of the variation in the thickness of the AlGaN layer ML in the semiconductor light emitting element 115b is, for example, about 1.6 nm.

On the other hand, in the semiconductor light emitting element 112a shown on FIG. 14C, there is little light and shade in the image. In other words, the surface of the first AlGaN layer ML1 in the semiconductor light emitting element 112a is flatter than the surface of the first AlGaN layer ML1 in the semiconductor light emitting elements 115a and 115b. The RMS of the variation in the thickness of the first AlGaN layer ML1 in the semiconductor light emitting element 112a is smaller than the RMS of the variation in the thickness of the first AlGaN layer ML1 in the semiconductor light emitting element 115a. For example, the RMS of the variation in the thickness of the first AlGaN layer ML1 in the semiconductor light emitting element 112a is about 0.5 nm. The RMS of the variation in the thickness of the first AlGaN layer ML1 is large when, for example, the Al composition ratio x1 of the first AlGaN layer ML1 is not less than 0.5.

FIGS. 14D to 14F are AFM images observing the surface of the first barrier layer BL1, after the first AlGaN layer ML1 has been formed, and after the other layers of the first light emitting layer EL1 (first n-side InGaN layer CLb1, first p-side InGaN layer CLa1, first barrier layer BL1, and the like.) have been formed.

FIGS. 14D to 14F correspond to the semiconductor light emitting elements 115a, 115b, and 112a, respectively.

By comparing FIGS. 14A and 14D, and comparing FIGS. 14B and 14E, it can be seen that the surface of the first barrier layer BL1 is very flat compared with the surface immediately after the first AlGaN layer ML1 is formed thereon.

In addition, by comparing FIGS. 14D and 14F, and comparing FIGS. 14E and 14F, it can be seen that the flatness of the first barrier layer BL1 is greater in the semiconductor light emitting elements 115a and 115b that in the semiconductor light emitting element 112a.

For example, in FIGS. 14D and 14E, there are fewer high concentration points (dark points) than in FIG. 14F. These points indicate holes in the first barrier layer BL1, for example.

Therefore, the surface of the first barrier layer BL1 of the semiconductor light emitting element 115a and the surface of the first barrier layer BL1 of the semiconductor light emitting element 115b are flatter than the surface of the first barrier layer BL1 of the semiconductor light emitting element 112a. For example, the surface of the first barrier layer BL1 of the semiconductor light emitting element 115a and the surface of the first barrier layer BL1 of the semiconductor light emitting element 115b have a step and terrace structure.

For example, the RMS of the variation in the thickness of the first barrier layer BL1 in the semiconductor light emitting element 115a is about 0.2 nm. For example, the RMS of the variation in the thickness of the first barrier layer BL1 in the semiconductor light emitting element 115b is about 0.3 nm. For example, the RMS of the variation in the thickness of the first barrier layer BL1 in the semiconductor light emitting element 112a is about 0.6 nm. For example, the surface of the p-type semiconductor layer 20 side of the first barrier layer BL1 is flatter than the surface of the first p-side InGaN layer CLa1 side of the first AlGaN layer ML1.

For example, in forming the first well layer WL1, in some cases, irregularities are formed on the surface of the first well layer WL1. The irregularities formed on the surface of the first well layer WL1 are filled up so that depressions are filled by the first AlGaN layer ML1 (for example, Al composition ratio x is not less than 0.5) which has large variation in the thickness. In this way, the flatness of the first InGaN layer CL1 and the flatness of the first barrier layer BL1 formed thereupon are improved. The holes observed in the surface of the first barrier layer BL1 are fewer. For example, the surface of the first p-side InGaN layer CLa1 on the first barrier layer BL1 side is flatter than the surface of the first AlGaN layer ML1 on the first p-side InGaN layer CLa1 side. The variation in the thickness of the first well layer WL1 is greater than the variation in the sum of the thickness of the first well layer WL1 and the thickness of the first AlGaN layer ML1. In other words, the variation in the thickness of the first well layer WL1 is greater than the variation in distance between the n-side barrier layer BLN and the first p-side InGaN layer CLa1.

The InGaN layer CL of the semiconductor light emitting element 115b is, for example, formed in a layer form. For example, the variation in the thickness of the light emitting layer EL is suppressed. The variation in the thickness of the light emitting layer EL is smaller than the variation in the thickness of the AlGaN layer ML.

The RMS of the variation in the thickness of the first AlGaN layer ML1 may be greater than the average value of the thickness of the first AlGaN layer ML1. The first AlGaN layer ML1 may include a plurality of portions that include AlGaN that are separated from each other. In other words, the first AlGaN layer ML1 may be formed in an island form. At least one portion of the plurality of portions that are separated from each other has a width of, for example, not less than 10 nm and not more than 200 nm, in at least one direction perpendicular to the Z-axis direction. For example, if the Al composition ratio x is not less than 0.5, the AlGaN layer ML may be in island form, for example.

For example, if the first AlGaN layer ML1 is formed in island form, the layer below the first AlGaN layer ML1 (for example, the first well layer WL1) and the layer above the first AlGaN layer ML1 (for example, the first InGaN layer CL1) partially contact.

By forming the first AlGaN layer ML1 with large variation in the thickness, and forming the first InGaN layer CL1 on the first AlGaN layer ML1 in layer form, the crystal quality of the light emitting layer EL is improved.

Figure 15:
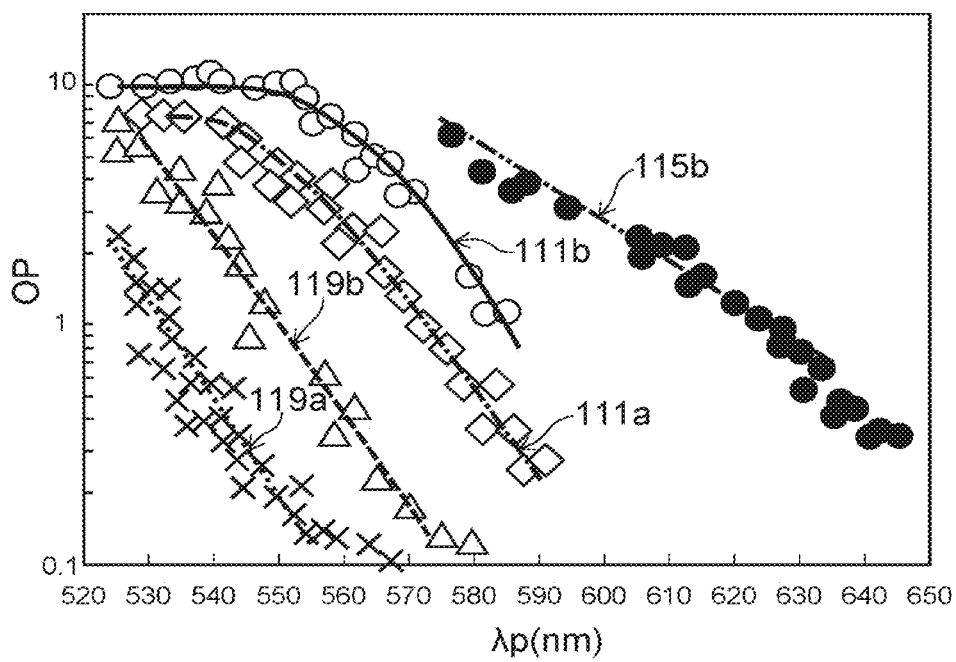
FIG. 15 is a graph showing the characteristics of semiconductor light emitting elements.

FIG. 15 is a graph showing the characteristics of semiconductor light emitting elements.

FIG. 15 is a graph in which data for the semiconductor light emitting element 115b is added to FIG. 4. The Al composition ratio x of the AlGaN layer ML of the semiconductor light emitting element 115b is 0.9.

As shown in FIG. 15, in the semiconductor light emitting element 115b with a high Al composition ratio x, the reduction in output OP when the peak wavelength λp is long is suppressed. For example, when the peak wavelength λp is not less than 570 nm, the suppression of the reduction in the luminous efficiency is significant.

For example, the first AlGaN layer ML1 is formed with a high Al composition ratio x and large variation in thickness. The first InGaN layer CL1 is formed in layer form on the first AlGaN layer ML1. In this way, the crystal quality of the light emitting layer EL is improved, and the luminous efficiency at longer wavelengths is increased.

Figure 16:
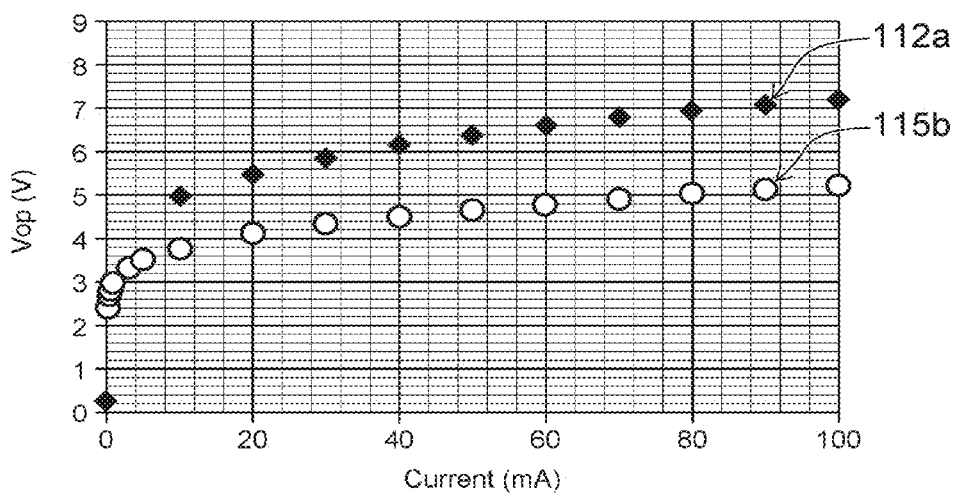
FIG. 16 is a graph showing the characteristics of a semiconductor light emitting element.

FIG. 16 is a graph showing the characteristics of a semiconductor light emitting element.

FIG. 16 shows the operating voltage Vop in the semiconductor light emitting element 112a and the semiconductor light emitting element 115b. In the semiconductor light emitting element 112a, the Al composition ratio x of the AlGaN layer ML is 0.3. In a semiconductor light emitting element 115b, the Al composition ratio x of the AlGaN layer ML is 0.9. In FIG. 16, the horizontal axis is current (mA). The vertical axis is operating voltage Vop (V). As shown in FIG. 16, the operating voltage of the semiconductor light emitting element 115b is lower than the operating voltage of the semiconductor light emitting element 112a.

For example, when the variation of the thickness of the first AlGaN layer ML1 is large, the area of the interface between the first AlGaN layer ML1 and the first well layer WL1 becomes larger. When the interface area is large, for example, the area over which current flows becomes large. For example, when the AlGaN layer ML is formed in island form, current can easily flow between each of the portions (each island) that include AlGaN and that are separated from each other. In this way, for example, in the semiconductor light emitting element 115b, it is considered that a low operating voltage can be obtained.

When the variation in the thickness of the AlGaN layer ML is comparatively large, in the regions where the thickness of the AlGaN layer ML is small, for example, current (for example, tunnel current) can easily flow. In this way, for example, in the semiconductor light emitting element 115b, it is considered that a low operating voltage can be obtained.

In the semiconductor light emitting element 115b, for example, the first InGaN layer CL1 which has a high In composition ratio y either contacts or is close to the first AlGaN layer ML1, which has a high Al composition ratio x. The difference in the lattice constant of the first InGaN layer CL1 and the lattice constant of the first AlGaN layer ML1 is large. For example, a large strain is produced in the first AlGaN layer ML1. As a result of the strain, a large electric field is generated in the first AlGaN layer ML1. For example, a triangular potential is produced in the first AlGaN layer ML1, which produces a mirror image effect. As a result, for example, current can easily flow.

In the semiconductor light emitting element according to this embodiment, for example, the first AlGaN layer ML1 is provided approaching the first well layer WL1. As a result, the reduction in the luminous efficiency due to the quantum confined Stark effect is suppressed. For example, when the Al composition ratio x of the AlGaN layer ML is not less than 0.5, the luminous efficiency at yellow or red wavelengths is improved.

For example, when the Al composition ratio x is not less than 0.5, the resistance of the AlGaN layer ML is increased, and the operating voltage of the semiconductor light emitting element may be increased too much. In contrast, in the semiconductor light emitting element 115b, the operating voltage can be reduced by increasing the variation in the thickness of the AlGaN layer ML.

By forming the AlGaN layer ML with a high Al composition ratio x and a large variation in thickness, the luminous efficiency at longer wavelengths is improved, so it is possible to provide a semiconductor light emitting elements with a lower operating voltage.

According to this embodiment, a highly efficient semiconductor light emitting element and method for manufacturing the same can be provided.

Note that in this specification, the term, "nitride semiconductor" includes semiconductors of all compositions wherein composition ratios of x, y, and z of the formula $B_xIn_yAl_zGa_{1-x-y-z}N$ fall within the respective ranges of $0 \leq x < 1$, $0 \leq y < 1$, $0 \leq z < 1$, and $x+y+z \leq 1$. Furthermore, with the formula described above, "nitride semiconductors" shall also be understood to include semiconductors further containing class V elements other than N (nitrogen), semiconductors further containing various elements added to control various physical characteristics such as conductivity type and the like, and semiconductors further containing various elements that are included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Embodiments of the invention with reference to examples were described above. However, the embodiments of the invention are not limited to these examples. For example, the scope of the invention includes all cases in which, for example, a person skilled in the art could make use of publicly known information to appropriately select constituents such as the n-type semiconductor layer, p-type semiconductor layer, light emitting unit, light emitting layers, well layers, barrier layers, AlGaN layer, InGaN layer, intermediate layer, nitride semiconductor, electrodes and the like included in the semiconductor light emitting element provided that the obtained effects are similar.

Further, any two or more components of the specific examples may be combined within the extent of technical feasibility and are included in the scope of the invention to the extent that the purport of the invention is included.

Moreover, all semiconductor light emitting elements and methods for manufacturing the same practicable by an appropriate design modification by one skilled in the art based on the semiconductor light emitting elements and methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
an n-type semiconductor layer including a nitride semiconductor;
a p-type semiconductor layer including a nitride semiconductor; and
a light emitting unit provided between the n-type semiconductor layer and the p-type semiconductor layer, the light emitting unit emitting light with a peak wavelength of not less than 530 nm,
the light emitting unit including an n-side barrier layer and a first light emitting layer,
the first light emitting layer including
a first barrier layer provided between the n-side barrier layer and the p-type semiconductor layer,
a first well layer contacting the n-side barrier layer between the n-side barrier layer and the first barrier layer,
a first AlGaN layer provided between the first well layer and the first barrier layer, the first AlGaN layer including $Al_{x1}Ga_{1-x1}N$ ($0.15 \leq x1 \leq 1$), and
a first p-side InGaN layer provided between the first AlGaN layer and the first barrier layer, the first p-side InGaN including $In_{ya1}Ga_{1-ya1}N$ ($0 < ya1 \leq 0.1$),
a first n-side InGaN layer provided between the first p-side InGaN layer and the first AlGaN layer, the first n-side InGaN layer including $In_{yb1}Ga_{1-yb1}N$ ($0 < yb \leq 0.1$),
a first p-side nitride including layer provided between the first p-side InGaN layer and the first n-side InGaN layer, the first p-side nitride including layer including $In_{za1}Ga_{1-za1}N$ ($0 \leq za1 < ya1$, $0 \leq za1 < yb1$), and
a first n-side nitride including layer provided between the first n-side InGaN layer and the first AlGaN layer, the first n-side nitride including layer including $In_{zb1}Ga_{1-zb1}N$ (0≤zb1<ya1, 0≤zb1<yb1), wherein a thickness of the first p-side InGaN layer is substantially the same as a thickness of the first p-side nitride including layer.

2. The element according to claim 1, wherein a distance between the first AlGaN layer and the first well layer is not more than 2 nanometers.

3. The element according to claim 1, wherein the first AlGaN layer is in contact with the first well layer.

4. The element according to claim 1, wherein
the x1 is not less than 0.25, and
a thickness of the first AlGaN layer is 1 atomic layer or more and not more than 2 nanometers.

5. The element according to claim 1, wherein
the x1 is not less than 0.3, and
a thickness of the first AlGaN layer is 1 atomic layer or more and not more than 2 nanometers.

6. The element according to claim 1, wherein
the x1 is not less than 0.25 and not more than 0.6, and
the peak wavelength is less than 570 nanometers.

7. The element according to claim 1, wherein
the x1 is not less than 0.3 and not more than 0.8, and
the peak wavelength is not less than 570 nanometers and not more than 600 nanometers.

8. The element according to claim 1, wherein
the x1 is not less than 0.4 and not more than 1.0, and
the peak wavelength is not less than 600 nanometers and not more than 750 nanometers.

9. The element according to claim 1, wherein
the x1 is not less than 0.5 and not more than 1, and
a surface on the first barrier layer side of the first p-side InGaN layer is flatter than a surface on the first p-side InGaN layer side of the first AlGaN layer.

10. The element according to claim 1, wherein
the x1 is not less than 0.5 and not more than 1, and
a surface on the p-type semiconductor layer side of the first barrier layer is flatter than a surface on the p-side InGaN layer side of the first AlGaN layer.

11. The element according to claim 1, wherein
the x1 is not less than 0.5 and not more than 1, and
a variation in a thickness of the first light emitting layer is smaller than a variation in a thickness of the first AlGaN layer.

12. The element according to claim 1, wherein
the x1 is not less than 0.5 and not more than 1, and
a variation in a thickness of the first well layer is larger than a variation in a distance between the n-side barrier layer and the first p-side InGaN layer.

13. The element according to claim 9, wherein
the first AlGaN layer includes a plurality of portions including $Al_{x1}Ga_{1-x1}N$, the portions are apart from each other, and
at least one of the portions has a width not less than 10 nanometers and not more than 200 nanometers in at least one direction perpendicular to a first direction from the first well layer toward the first barrier layer.

14. The element according to claim 1, wherein
the ya1 is not less than 0.002 and not more than 0.05, and
a thickness of the first p-side InGaN layer is 1 atomic layer or more and not more than 2 nanometers.

15. The element according to claim 1, wherein the first light emitting layer further includes a first intermediate layer provided between the first AlGaN layer and the first well layer, and
a band gap energy of the first intermediate layer is higher than a band gap energy of the first well layer, and lower than a band gap energy of the first AlGaN layer.

* * * * *